United States Patent [19]

Suwanai et al.

[11] Patent Number: 5,994,762
[45] Date of Patent: Nov. 30, 1999

[54] SEMICONDUCTOR INTEGRATED CIRCUIT DEVICE INCLUDING BORON-DOPED PHOSPHO SILICATE GLASS LAYER AND MANUFACTURING METHOD THEREOF

[75] Inventors: Naokatsu Suwanai, Tokyo; Yasuhide Fujioka, Chitose, both of Japan

[73] Assignee: Hitachi, Ltd., Tokyo, Japan

[21] Appl. No.: 08/686,763

[22] Filed: Jul. 26, 1996

[51] Int. Cl.[6] .................................................. H01L 23/28
[52] U.S. Cl. ........................ 257/620; 257/637; 257/638; 438/700; 438/624; 438/68
[58] Field of Search .................................. 438/624, 637, 438/694, 700, 783, 723; 257/760, 798, 620, 637, 638, 368

[56] References Cited

U.S. PATENT DOCUMENTS 4,412,242 10/1983 Herman et al. .
5,237,199 8/1993 Morita .
5,296,745 3/1994 Shirai et al. .

FOREIGN PATENT DOCUMENTS 6-77315 3/1994 Japan .
6-260554 9/1994 Japan .

Primary Examiner—Caridad Everhart
Attorney, Agent, or Firm—Antonelli, Terry, Stout & Kraus, LLP.

[57] ABSTRACT

A semiconductor integrated circuit device is provided in which an interlayer insulation film deposited on a semiconductor chip includes a boron-containing silicon oxide film and a second film deposited on the boron-containing silicon oxide film. A guard ring is disposed adjacent to the periphery of the semiconductor chip, and a slit is disposed between the guard ring and the periphery of the chip. The depth of the slit is selected such that cracks formed on the boundary between the BPSG film and the second film are inhibited by the slit from intruding further along the boundary to the inside of the chip, thereby preventing moisture or obstacles from reaching the inside of the chip through the cracks.

44 Claims, 16 Drawing Sheets

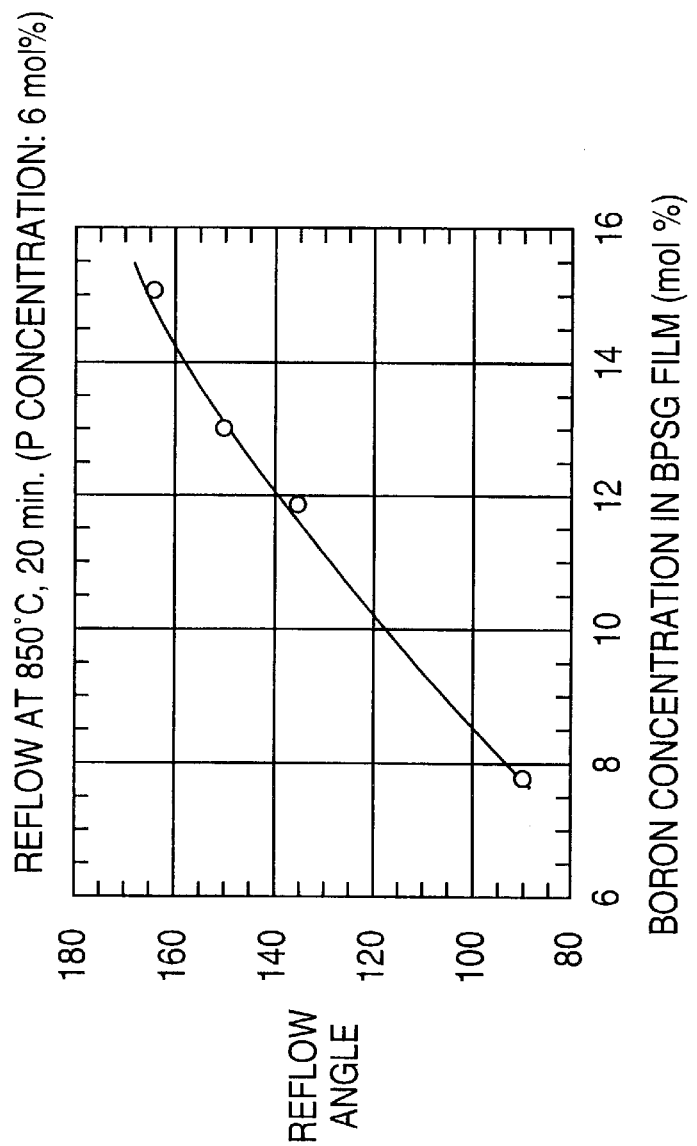
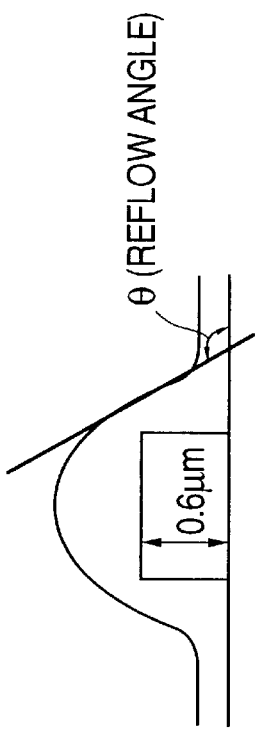
FIG. 12

SEMICONDUCTOR INTEGRATED CIRCUIT DEVICE INCLUDING BORON-DOPED PHOSPHO SILICATE GLASS LAYER AND MANUFACTURING METHOD THEREOF

BACKGROUND OF THE INVENTION

The present invention concerns a semiconductor integrated circuit device and a manufacturing technique thereof and, more particularly, it relates to a technique which is effective when applied to a device using BPSG (Boron-Doped Phospho Silicate Glass) film for a portion of an interlayer insulation film.

Along with reduction of the size and increase in the integration degree of LSI devices, an undesirable side-effect has been an increase in the size of wiring steps of such semiconductor devices. For instance, large capacity DRAMs (Dynamic Random Access Memory) in recent years have used a stack capacitor structure for compensating the reduction of a storage charge amount (Cs) of an information storage capacitance device which typically takes place with size reduction of a memory cell. In such a stack capacitor structure, the information storage capacitance device is disposed above a memory cell selecting MISFET. As a result, a step corresponding substantially to the height of the information storage capacitance device is formed between a memory array and a peripheral circuit. Further, such a step is formed also in a region of the memory array and the region of the peripheral circuit.

If wirings are formed on such a step, defocusing of exposure light is caused upon photolithography or an etching residue is formed at the step, so that wirings cannot be formed with high accuracy. This can cause failures such as short-circuiting or disconnection.

For overcoming the foregoing problems, it is essential to provide a technique capable of flattening an interlayer insulation film that insulates wirings in a lower layer and wirings in an upper layer. For the flattening of the interlayer insulation film, various methods have been developed. Examples of such techniques include a method of using a BPSG film or a spin on glass film having high reflowing property, a bias ECR plasma CVD method of simultaneously conducting film formation and sputter etching, or a chemical mechanical polishing method.

For instance, Japanese Patent Laid-Open No. Hei 7-122654 provides a DRAM designed for reduction of steps by the combination of flattening by a BPSG film by reflowing and flattening using a spin-on-glass film. The BPSG film comprises boron (B) containing silicon oxide and phosphorus (P) each by several mol %. The surface the film after formation by a CVD method is flattened by annealing reflow. In a case of using the spin-on-glass film, a silicon oxide film is at first deposited by a plasma CVD method, then a spin-on-glass film is deposited thereon by a rotary coating method. Subsequently, the spin-on-glass film is baked to densify the film, then the surface of the film is flattened by etching back and, further, a silicon oxide film is deposited on the surface by a plasma CVD method to form a flat interlayer insulation film.

In a production process for such an LSI, a semiconductor wafer having LSI formed thereon is subjected to dicing, and is divided into semiconductor chips. These chips are attached one by one to a lead frame (pellet attaching), subjected to wire bonding and then encapsulated with a molding resin.

Since the dicing for the semiconductor wafer is mechanically applied by using, for example, a diamond blade, fine cracks are formed at side walls of the semiconductor chip along which moisture or obstacles may intrude to the inside of the chip to bring about corrosion of the wirings. In order to prevent this, a guard ring is usually provided around the periphery of the semiconductor chip. The guard ring is formed by burying a wiring material for the circuit (aluminum alloy or tungsten) along the inside of a groove formed along the periphery of the semiconductor chip, whereby moisture or obstacles intruding from the side wall of the chip are interrupted from further invasion into the chip by the wiring material.

In a case of using a BPSG film for a portion of the interlayer insulation film, it has been found by the study of the present inventors that if the concentration of boron (B) in the film is higher than a certain level, cracks generated at the end of the chip reach the inside of the chip penetrating the guard ring and, as a result, moisture or the like intrudes through the cracks into the chip to bring about corrosion of wirings. As the result of these studies, it has been found that the relationship between the boron concentration in the BPSG film and the cracks formed at the end of the chip is substantially as discussed below.

FIG. 12($a$) is a graph showing the result of the study for a relationship between the boron concentration in the BPSG film (unit: mol %) and reflow angle ($\theta$) on the side wall of the wiring in a case such as shown in FIG. 12($b$) of depositing a BPSG film by a CVD method on a substrate having wirings formed thereon and applying reflow. The thickness of the wiring is 0.6 $\mu$m and reflow conditions are 850° C. for a period of 20 minutes. Further, since the concentration of phosphorus in the BPSG film has less effect on the reflow angle as compared with the boron concentration, it is set to 6 mol %. As shown in the graph, the reflow angle ($\theta$) is increased and the film flatness is improved as the boron concentration in the BPSG film becomes higher.

It can be seen from the result described above that, since the wiring step undesirably is increased with reduction of the size and increase of the integration degree of an LSI device, the boron concentration in the film has to be made higher for ensuring the flatness of the BPSG film. Further, for reducing the size and increasing the integration degree of such an LSI device, the depth of the pn junction such as in source and drain regions of MISFETs of the device has to be decreased, and annealing for the BPSG film has to be conducted at a lower temperature for attaining a shallow junction. However, the film reflowing property is deteriorated as the annealing temperature is lowered. Accordingly, the concentration of boron in the film has to be increased for ensuring satisfactory reflowing properties at the lower temperature.

For instance, in a 4 Mbit DRAM manufactured using a 0.8 $\mu$m design rule, a BPSG film of 7 to 8 mol % of boron concentration is annealed at a temperature of about 950° C. In a case of a 16 Mbit DRAM manufactured using about a 0.5 $\mu$m design rule, since an equivalent or higher reflowing property has to be ensured, it is required to apply annealing at a temperature of about 850° C. in view of the improvement for the performance of transistors. For this purpose, it is necessary to use a BPSG film having a boron concentration higher than 10 mol %, and it is preferable to use a BPSG film containing boron at about 13 mol % taking into account variations of the boron concentration.

Unfortunately, notwithstanding the above-discussed advantages, it has been found that the following problems are brought about as the boron concentration in the BPSG film is made higher. FIG. 13 is a graph showing the result of a relationship between the boron concentration (unit: mol %) in a BPSG film and wiring failure rate caused by occurrence of cracks at the end of the chip. As shown in the graph, if the boron concentration in the BPSG film exceeds about 15 mol %, the failure rate increases abruptly.

As a reason for this drawback, it may be considered that when the boron concentration in the BPSG film is higher, the hygroscopic property of the film is increased. Therefore, if an insulation film (for example, a silicon oxide film deposited by a plasma CVD method) is deposited on the moisture absorbing film, since adhesion with the insulation film is lowered, minute cracks generated at the chip end during dicing grow along the boundary of the film to the inside of the chip. This can occur, for example, during high temperature high humidity testing of packages (a standing test under a circumstance, for example, at a temperature of 85° C. and humidity of 85%).

It may be also considered that a dense and hard insulation film such as a silicon nitride film deposited by a plasma CVD method is used as the material of a passivation film covering the surface of a semiconductor chip in order to protect the inside of the chip. However, the passivation film constituted with such a material has a high film rigidity which creates a large stress on the underlying interlayer integration film. This accelerates the growth of any cracks that may have been created.

Namely, it is assumed that if the boron concentration in the BPSG film is increased to about 15 mol %, the film absorbs moisture when connection holes are formed in a state where the surface of the film is exposed or when wirings are formed by patterning a metal film deposited on the film. If the insulation film is deposited on the moisture absorbing BPSG film, the adhesion at the boundary of the film is lowered, and minute cracks generated at the end of the chip grow along the boundary. Then, growth of the cracks is further accelerated by stresses from the highly rigid passivation film. These cracks cut the guard ring and can reach as far as the inside of the chip, so that the water proofing function of the guard ring is lost, resulting in corrosion of wirings.

This problem is shown in FIG. 16, for example, which also shows the phenomenon of peeling.

Specifically, FIG. 16 shows an arrangement wherein a BPSG silicon oxide film 20 having a high boron concentration is formed on a semiconductor substrate 1. An additional insulating film (not containing boron), such as a TEOS film 23, is formed on the BPSG film 20, and a hard passivation film, such as P-SiN film 26 is formed over the insulating film 23. As discussed above, the high concentration of boron in the BPSG film 20 causes poor adhesion between the film 20 and the overlaying insulator 23. This leads to separation cracks between the two layers in the area between the guard ring and the edge of the chip. Due to the extreme hardness of the overlying P-SiN layer 26, the separation cracks between the layers 20 and 23 tend to extend inside the area of the guard ring, thereby permitting moisture to undesirably reach inside of the device.

As described above, in a case of the 16 Mbit DRAM manufactured using about a 0.5 $\mu$m design rule, it is required to use a BPSG film containing about 13 mol % of boron. Therefore, the boron concentration in the film is increased to a concentration which can bring about deterioration of the film adhesion (about 15 mol %) depending on the condition of forming the BPSG film. Accordingly, there is a possibility of causing wiring corrosion due to cracks.

From the foregoing discussion, in a case of using a BPSG film containing boron at high concentration for a portion of the interlayer insulation film material in a device manufactured using a 0.5 $\mu$m or finer design rule, a countermeasure is indispensable for preventing wiring corrosion caused by cracks along the boundary of the film described above.

SUMMARY OF THE INVENTION

An object of the present invention is to provide a technique capable of effectively preventing cracks formed along the boundary between a BPSG film and an insulation film deposited thereon from reaching the inside of a chip in a device in which a BPSG film containing boron at high concentration is applied with heat treatment (reflow) thereby flattening the interlayer insulation film.

Another object of the present invention is to provide a technique capable of attaining the foregoing object without increasing the number of manufacturing steps for the device.

A summary of some of the features of the present invention disclosed in the present application will be explained briefly below.

(1) In a semiconductor integrated circuit device according to the present invention, an interlayer insulation film deposited on a semiconductor chip includes a boron-containing silicon oxide film, and a slit is disposed along the periphery of the semiconductor chip at a predetermined depth such to prevent the spread of the above-mentioned cracks.

(2) In semiconductor integrated circuit device according to the present invention, the slit is disposed to the outside of a guard ring.

(3) A semiconductor integrated circuit device according to the present invention can be a DRAM having a memory cell with a stack structure in which an information storage capacitance device is disposed above a memory selecting MISFET, and a boron-containing silicon oxide film is included as part of the interlayer insulation film in a layer above the memory cell.

(4) A semiconductor integrated circuit device according to the present invention can comprise a semiconductor substrate having a first region as a peripheral portion of a rectangular main surface and a second region inside of the first region, a plurality of MISFETs each formed in the second region and having a source region, a drain region and a gate electrode, a boron-containing silicon oxide film formed in the first region and the second region and having a first connection hole in the first region for exposing a semiconductor region formed on the main surface of the semiconductor substrate and a second connection hole in the second region for exposing the source region or the drain region of the plurality of MISFETs, a first conductor layer formed in the first connection hole and on the boron-containing silicon oxide film in the first region, a second conductor layer formed in the second connection hole and on the boron-containing silicon oxide film in the second region, and a silicon oxide film not containing boron formed on the first and the second conductor layers, in which the first conductor layer is disposed continuously along the peripheral portion of the rectangular main surface, and a groove penetrating a boundary between the boron-containing silicon oxide film and the silicon oxide film not containing boron is formed to the outside of the first conductor layer in the first region.

(5) A method of manufacturing a semiconductor integrated circuit device according to the present invention can comprise the steps of: forming a first insulation film on a main surface of a semiconductor substrate, forming a first wiring layer on the first insulation film, forming a second insulation film comprising a boron-containing silicon oxide film on the first wiring layer, forming a second wiring layer on the second wiring film, forming a third insulation film comprising a silicon oxide film not containing boron on the second wiring layer, and aperturing a connection hole for exposing the second wiring layer to the third insulation film and aperturing a groove to the peripheral portion of the main surface of the semiconductor substrate from the third insulation film to a boundary between the third insulation film and the second insulation film.

(6) A method of manufacturing a semiconductor integrated circuit device according to the present invention forms a slit by utilizing an etching step of forming the guard ring and an etching step of forming a pad by aperturing a passivation film covering the surface of the semiconductor chip.

According to the technical means described above, since cracks generated on the boundary between the boron-containing silicon oxide film and the insulation film in the layer thereabove can be prevented from developing to the inside by the slit, wiring corrosion caused by moisture intruding from the outside through cracks can satisfactorily be prevented.

According to the technical means described above, since the slit is formed by utilizing the etching step of forming the guard ring and an etching step of forming the pad by aperturing the passivation film covering the surface of the semiconductor chip, the slit can be formed without increasing the number of manufacturing steps.

BRIEF DESCRIPTION OF THE DRAWINGS

These and other objects, as well as novel features of the present invention will become apparent by reading the descriptions of the specification and appended drawings, wherein.

Figure 6:
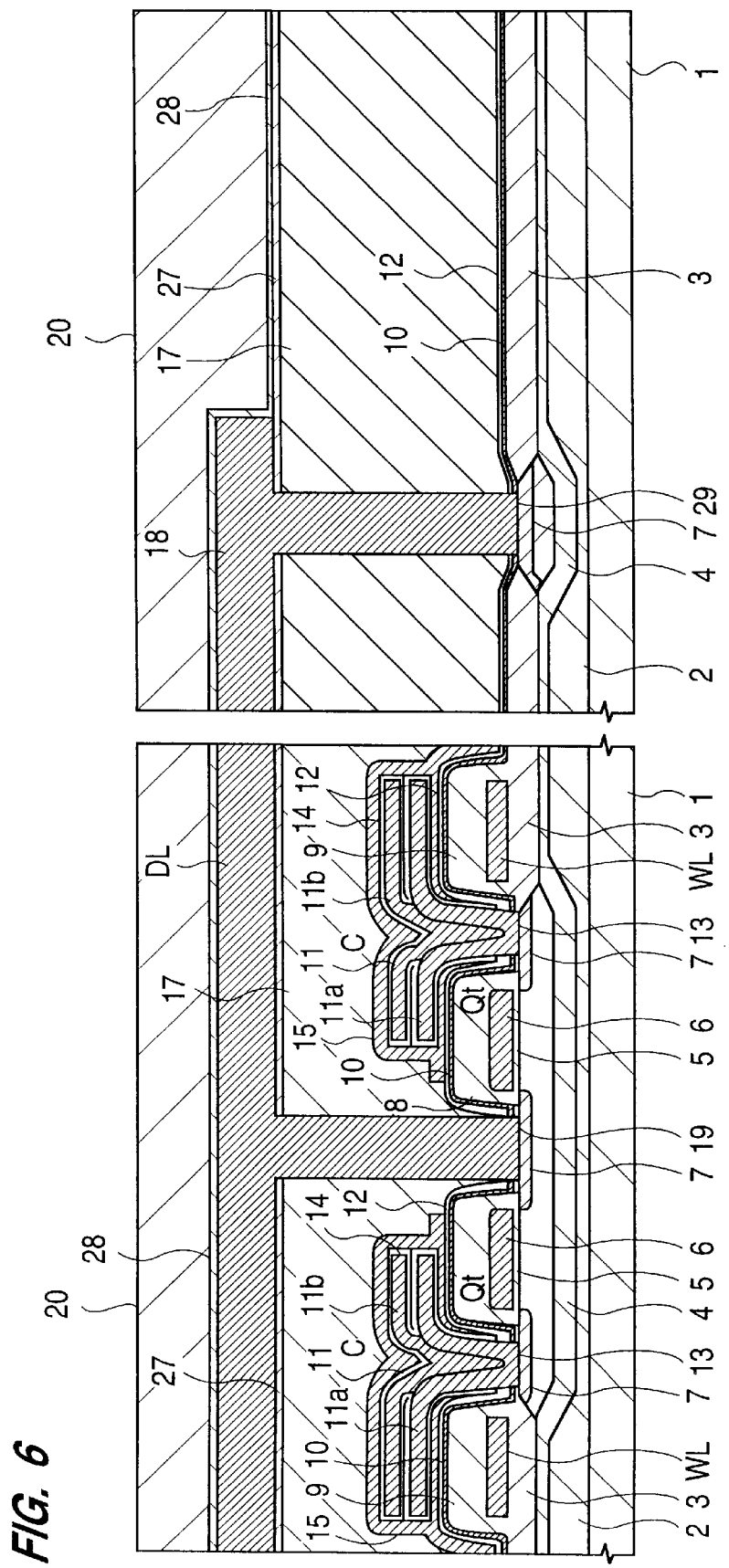
Figure 7:
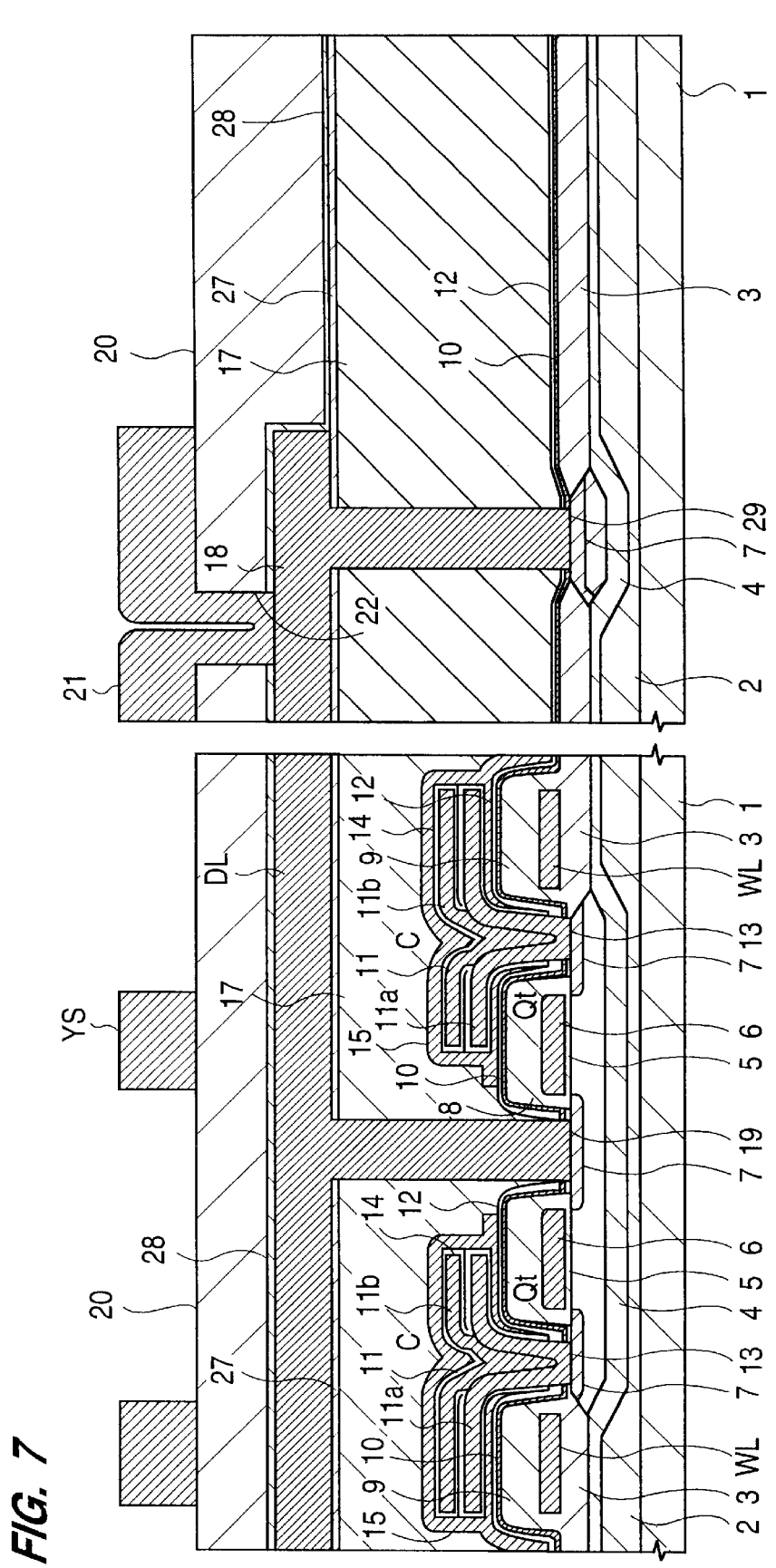
Figure 8:
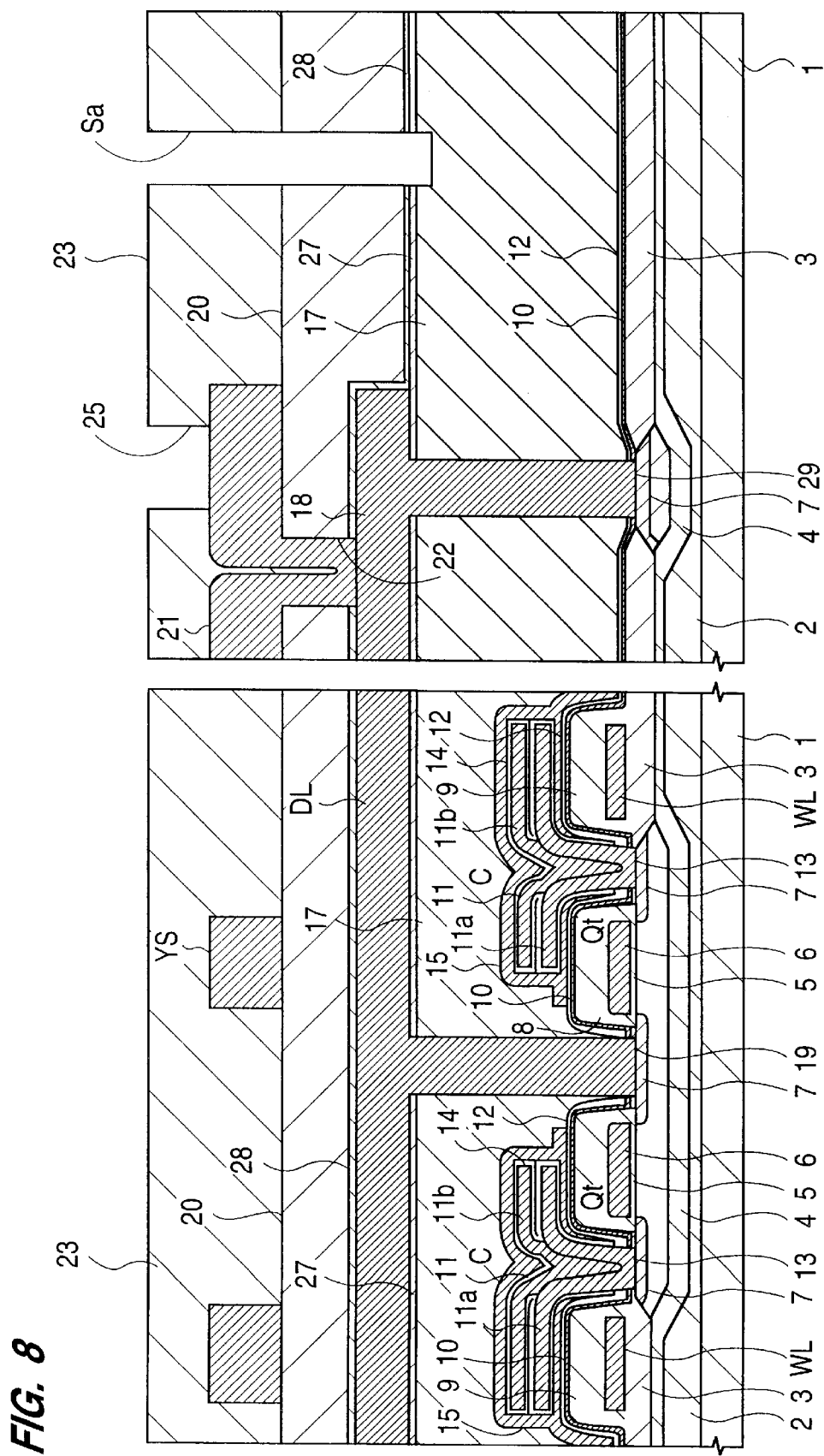
Figure 9:
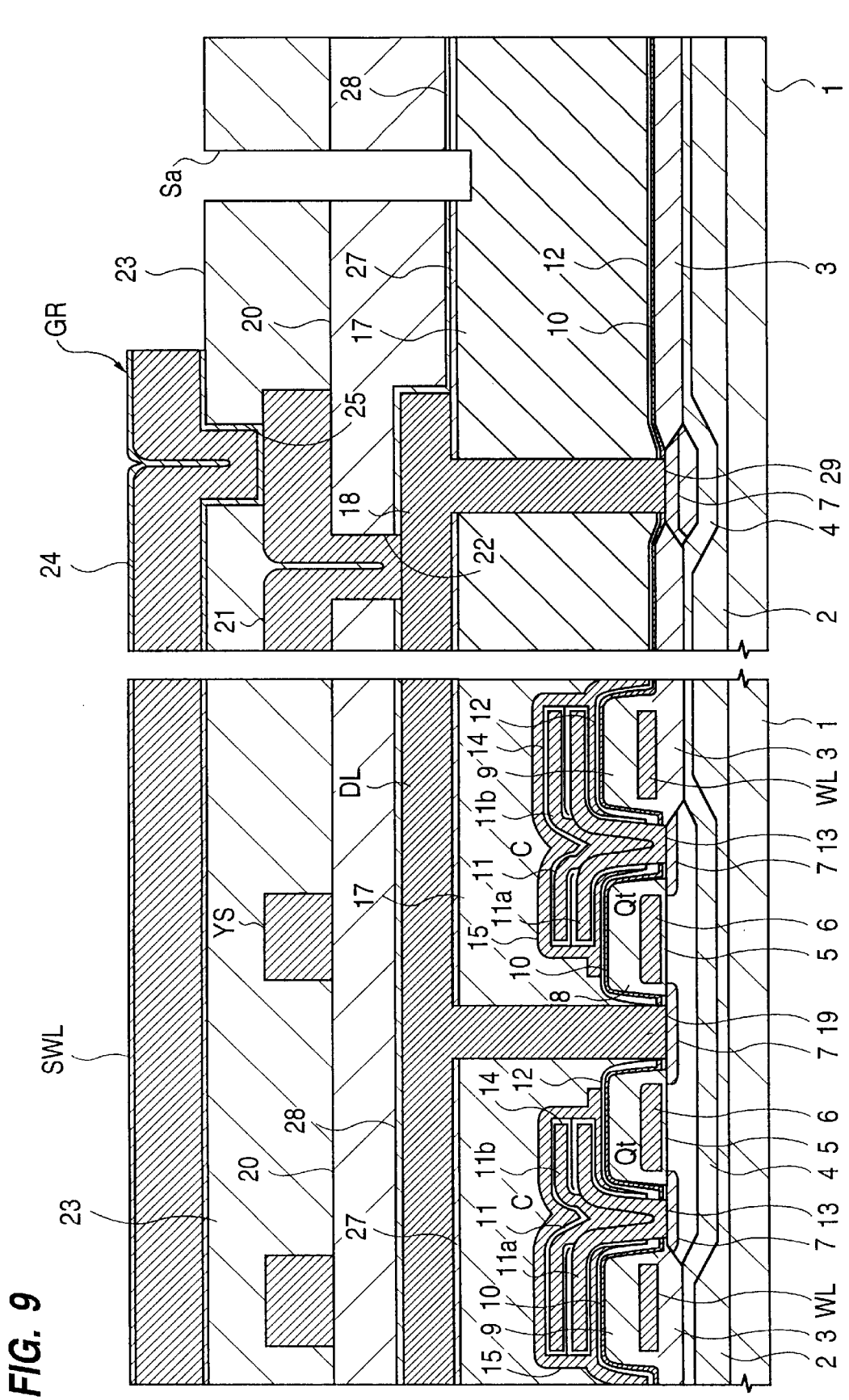
Figure 10:
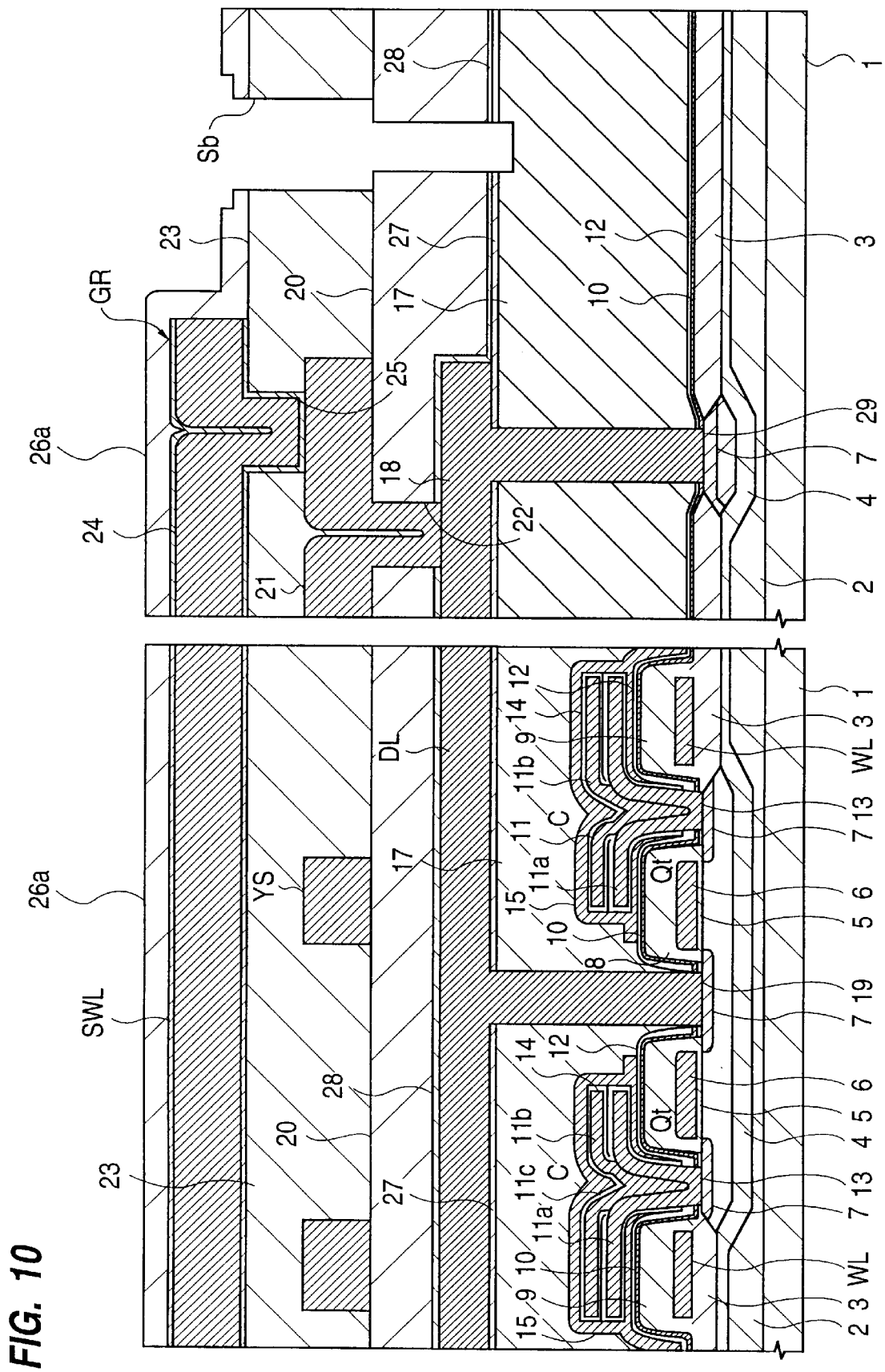
Figure 11:
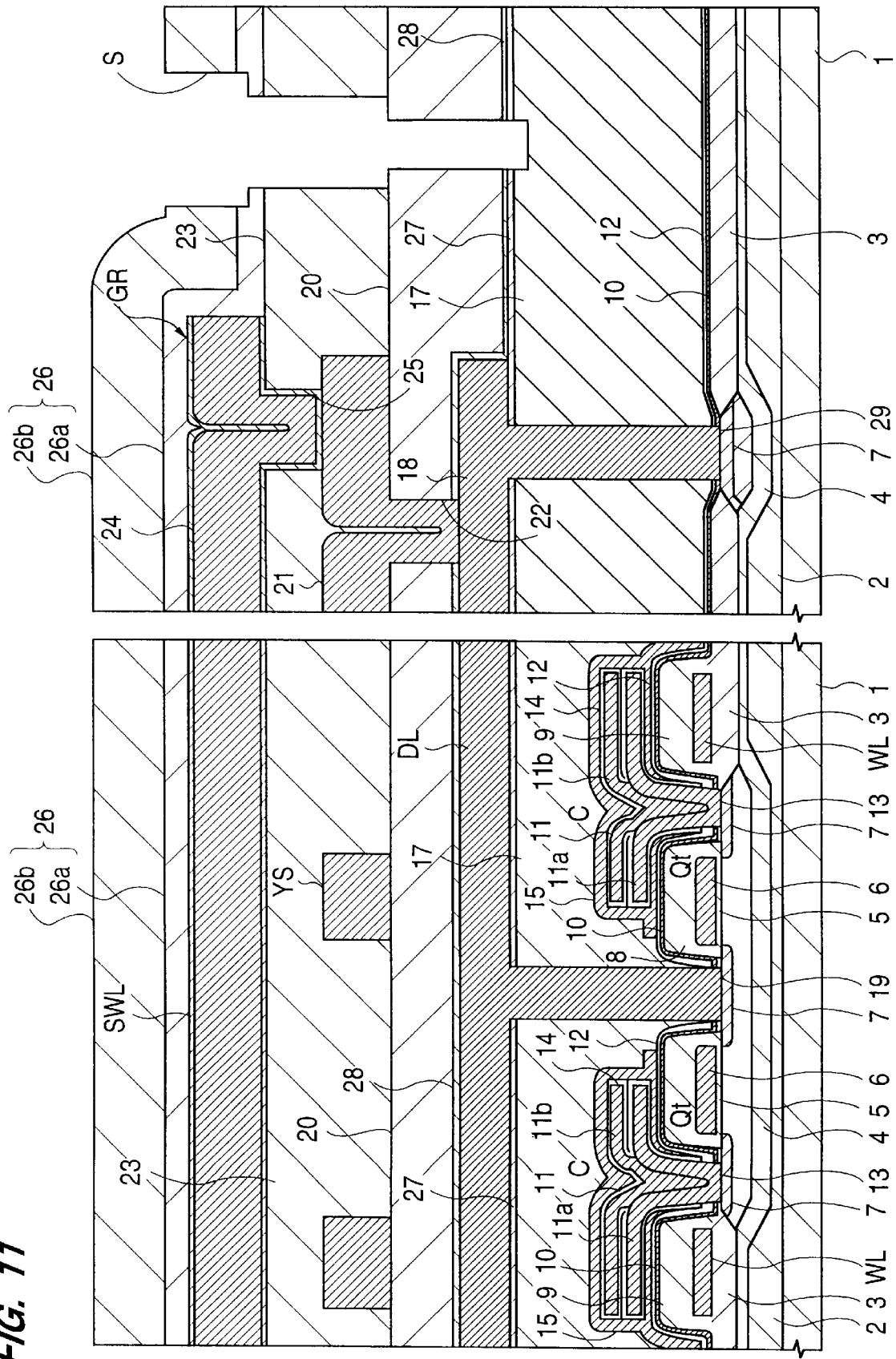
Figure 13:
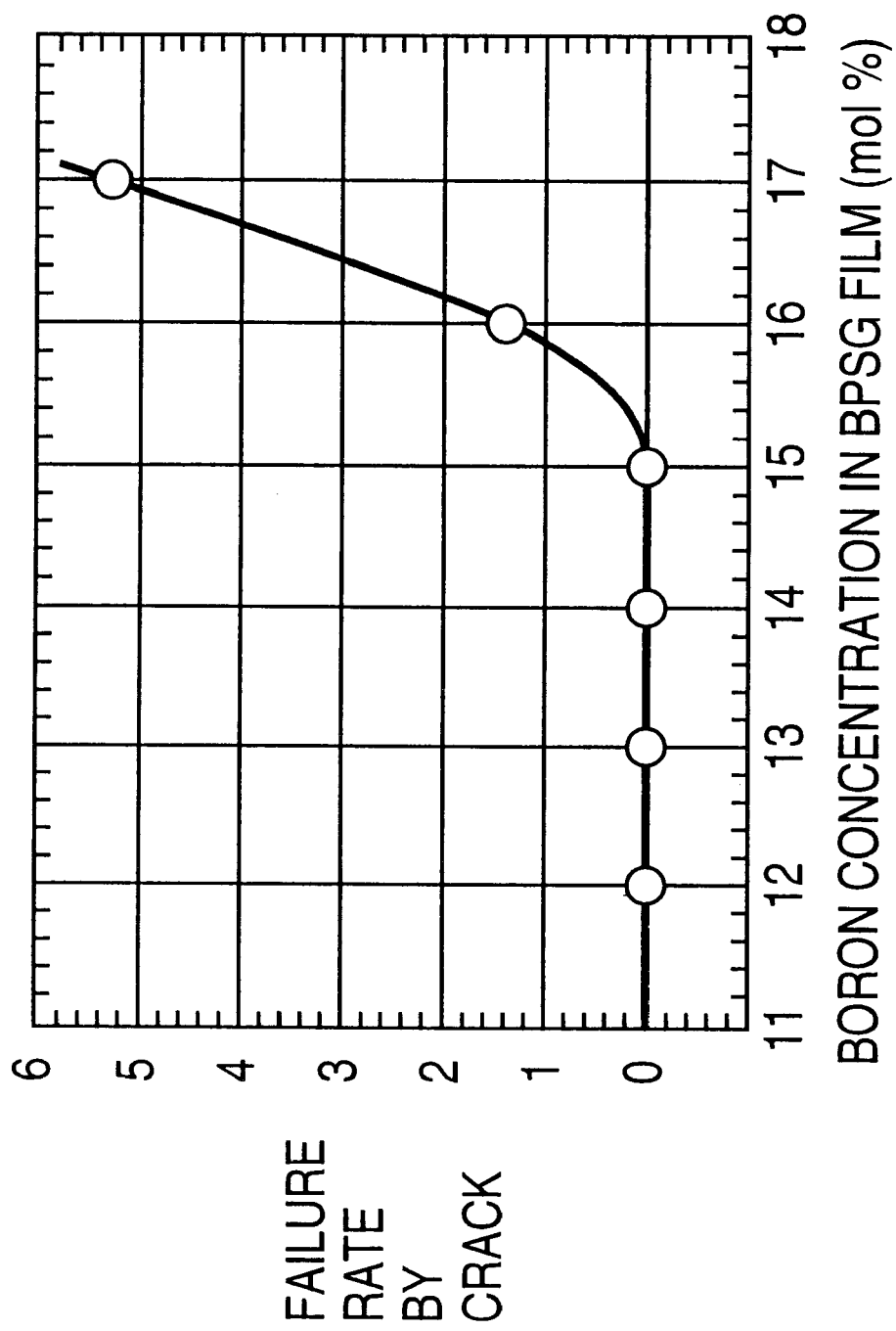

FIG, 5 is a cross sectional view of a principal portion of a semiconductor substrate illustrating a method of manufacturing a DRAM as one embodiment according to the present invention;

FIG. 6 is a cross sectional view of a principal portion of a semiconductor substrate illustrating a method of manufacturing a DRAM as one embodiment according to the present invention;

FIG. 7 is a cross sectional view of a principal portion of a semiconductor substrate illustrating a method of manufacturing a DRAM as one embodiment according to the present invention;

FIG. 8 is a cross sectional view of a principal portion of a semiconductor substrate illustrating a method of manufacturing a DRAM as one embodiment according to the present invention;

FIG. 9 is a cross sectional view of a principal portion of a semiconductor substrate illustrating a method of manufacturing a DRAM as one embodiment according to the present invention;

FIG. 10 is a cross sectional view of a principal portion of a semiconductor substrate illustrating a method of manufacturing a DRAM as one embodiment according to the present invention;

FIG. 11 is a cross sectional of a principal portion of a semiconductor substrate illustrating a method of manufacturing a DRAM as one embodiment according to the present invention;

FIG. 12($a$) is a graph illustrating a relationship between a boron concentration in a BPSG film and a reflow angle for a side wall of wirings and FIG. 12($b$) is a diagram illustrating reflow angle;

FIG. 13 is a graph illustrating a relationship between the boron concentration in BPSG film and wiring failure rate caused by occurrence of cracks at the end of a chip.

Figure 14:
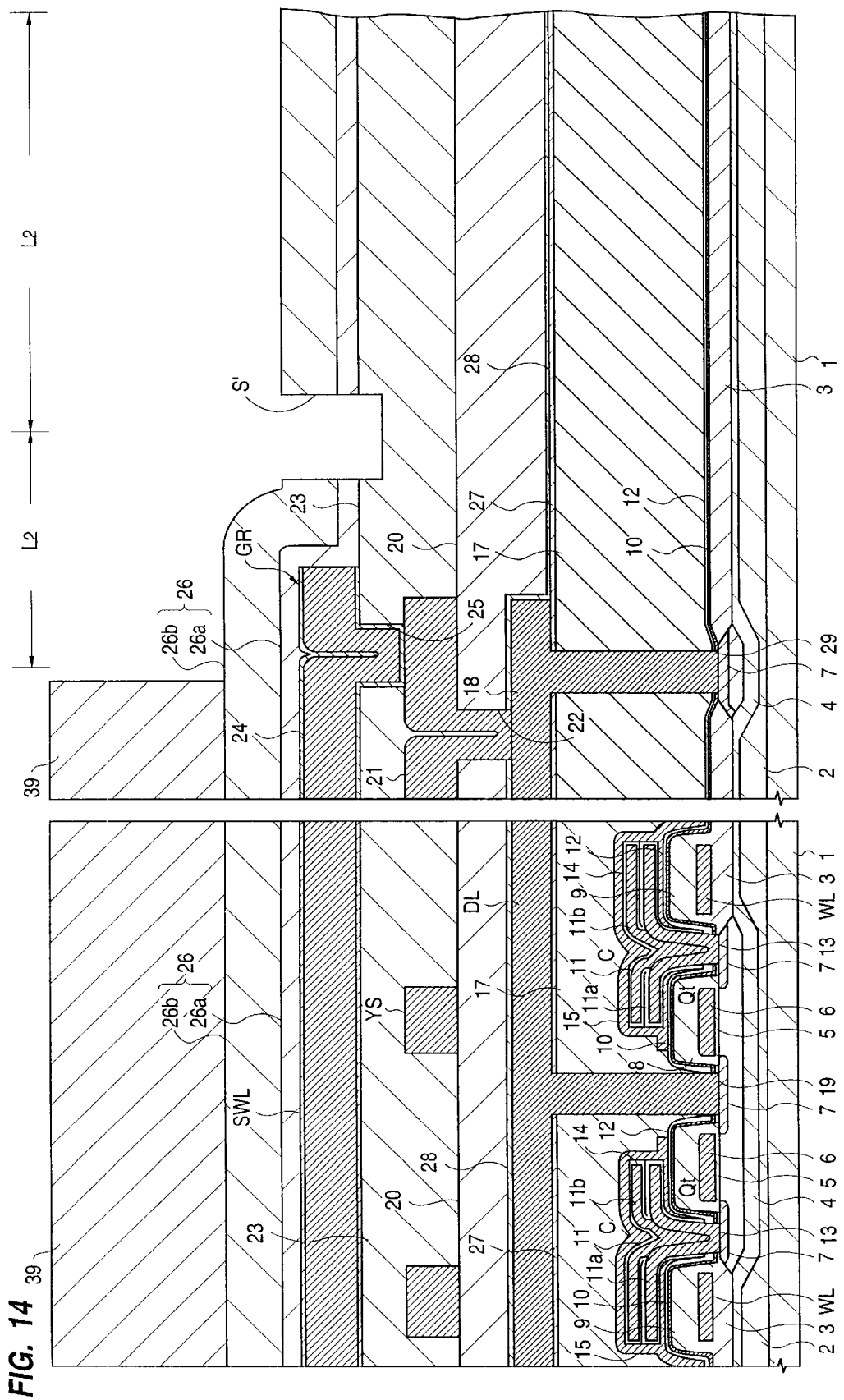

FIG. 14 is a cross-sectional view of a modified embodiment of the present invention.

Figure 15:
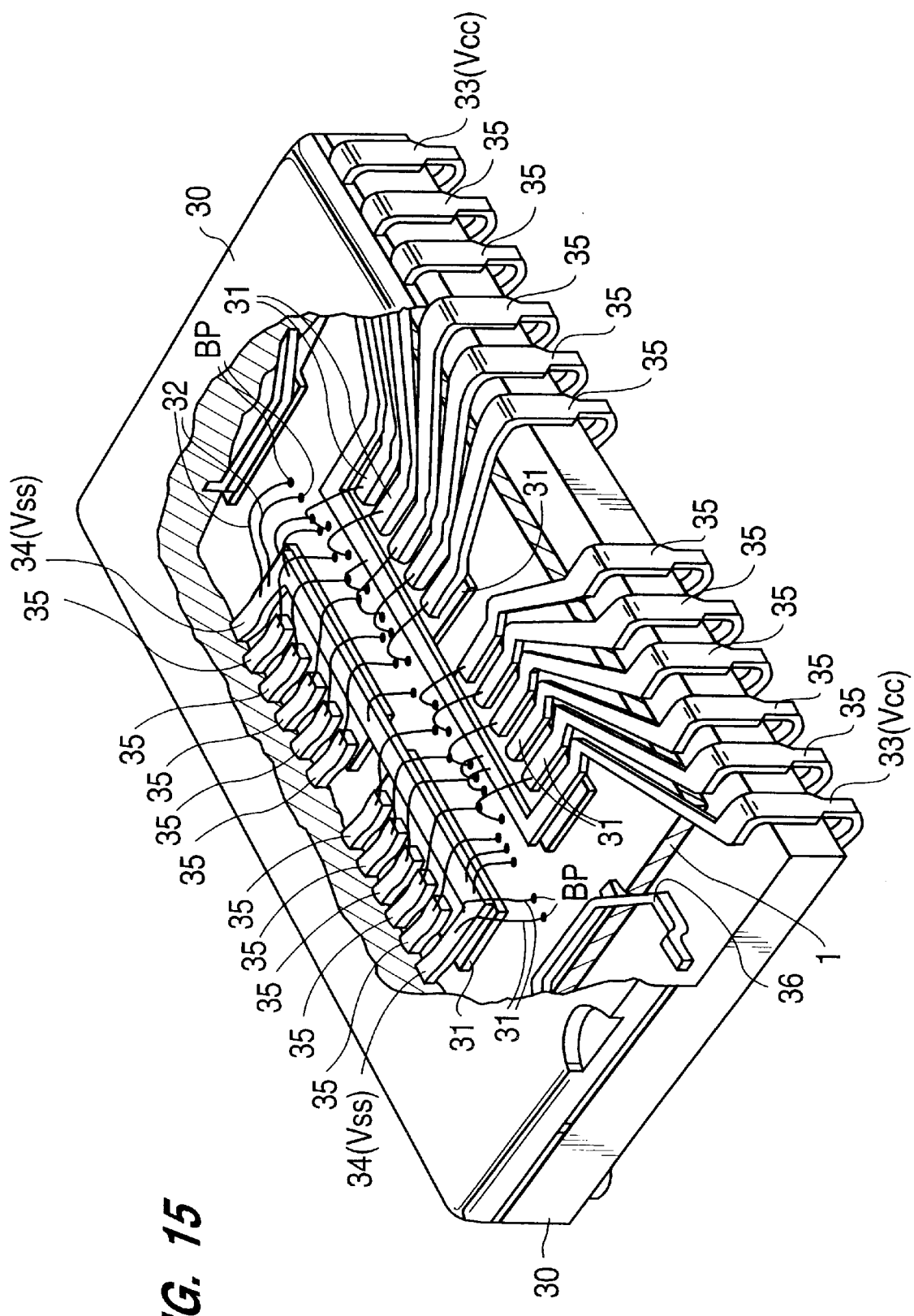

FIG. 15 is perspective view of a package for housing a chip formed in accordance with the present invention.

Figure 16:
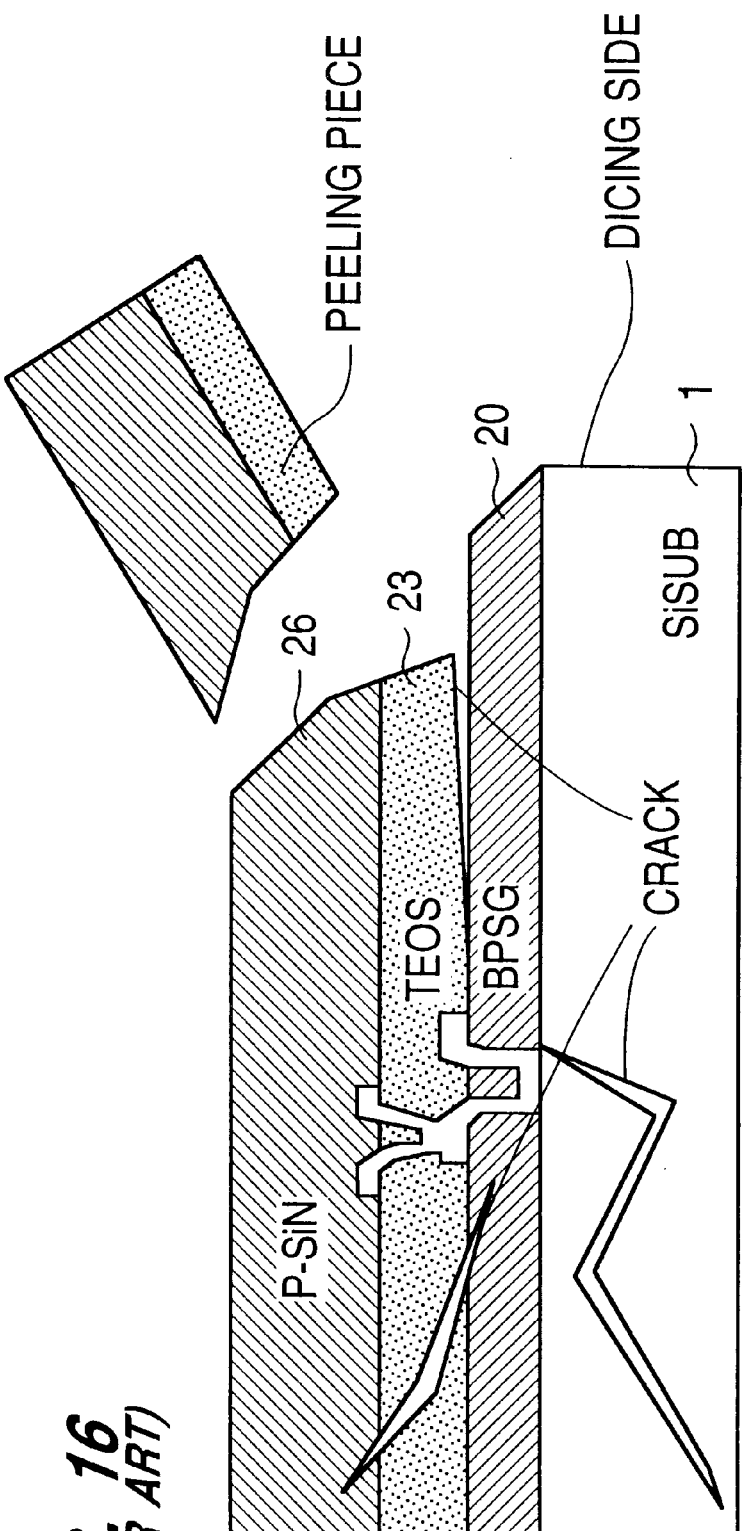

FIG. 16 is a cross-sectional view of a prior art device showing a problem in such a device.

DESCRIPTION OF THE PREFERRED EMBODIMENTS

The present invention will be explained more specifically by way of examples with reference to the drawings. For the explanation of the embodiments, those components having identical functions carry the same reference numerals throughout the drawings, for which duplicate explanations will be omitted.

Figure 1:
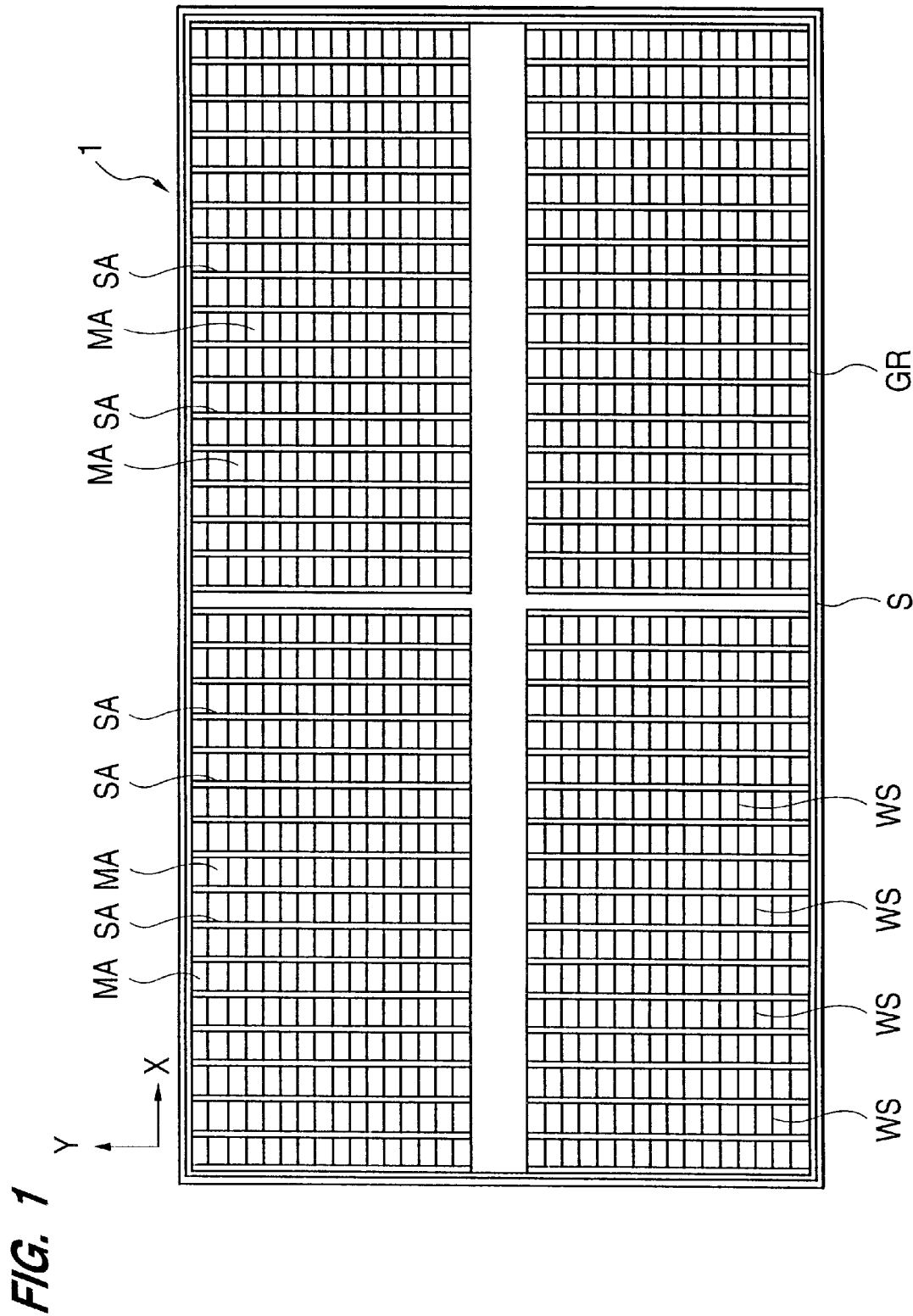
FIG. 1 is a plan view illustrating an appearance of a semiconductor chip on which a DRAM is formed as one embodiment according to the present invention.

FIG. 1 is a plan view illustrating an appearance of a semiconductor chip on which a DRAM as a preferred embodiment according to the present invention is formed. As shown in the drawing, a plurality of memory arrays MA are disposed in a matrix along a direction X (longer side of semiconductor chip 1) and a direction Y (shorter side of semiconductor chip 1) on the main surface of a semiconductor chip 1 made of single crystal silicon.

A row of sense amplifiers SA is disposed between memory arrays MA which are adjacent with each other along the direction X, while a word line shunt portion WS is disposed between memory arrays MA which are adjacent with each other along the direction Y. Namely, each of the memory arrays MA is disposed in a region defined at the periphery thereof with a row of sense amplifiers SA extending in the direction Y and the word line shunt portion WS extending in the direction X.

In a central portion on the main surface of the semiconductor chip 1, control circuits such as a word line driving circuit or a data line selection circuit, an input/output circuit and bonding pads (not illustrated) are disposed. Further, a guard ring GR is disposed continuously with no disconnection along the outer circumference of the main surface of the semiconductor chip 1 so as to surround the circuits described above for protecting the circuits from moisture, contaminating materials or ambient external electric disturbances.

The feature of the semiconductor chip 1 in this embodiment resides in a slit (groove) S disposed at the outermost circumference of the main surface of the semiconductor chip 1, that is, further to the outside of the guard ring GR, in order to prevent cracks formed at a boundary between the BPSG film and the insulation film thereabove, to be described later, from reaching the inside of the chip. The slit S is continuously disposed with no disconnection so as to surround the guard ring GR.

Next, the construction of the memory array MA, the guard ring GR and the slit S formed at the outer circumference of the chip will be explained with reference to FIG. 2. In the figure, a left-half part is a cross sectional view for the memory array MA and a right-half part is a cross sectional view for the outer circumference of the chip.

A p-type well 2 is formed on the main surface of the semiconductor substrate 1 made of p-type single crystal silicon. A device-isolation field oxide film 3 is formed on the main surface in an inactive region of the p-type well 2, and a p-type channel stopper layer 4 is formed in the p-type well 2 including a lower portion of the field oxide film 3. A predetermined substrate voltage (VBB) is applied to the p-type well 2 for preventing erroneous operation of a memory cell.

The memory cells of the DRAM are formed on the main surface in an active region of the p-type well 2 surrounded with the field insulation film 3. Each memory cell comprises a memory cell selecting MISFET Qt of an n-channel type and an information storage capacitance device C disposed thereabove.

The memory cell selecting MISFET Qt comprises a gate oxide film 5, a gate electrode 6, and a pair of n-type semiconductor regions 7, 7 (source and drain regions). The gate electrode 6 is formed integrally with the word line WL. The gate electrode 6 and the word line WL are preferably formed with a polycrystal silicon film of a first layer. An n-type impurity (for example, P) is introduced to the polycrystal silicon film for reducing the resistance value. The gate electrode 6 (word line WL) may also be formed with a polycide film in which a high melting silicide film such as $WSi_x, Mosi_x, TiSi_x$ or $TaSi_x$ is laminated on the polycrystal silicon film.

A side wall spacer 8 of silicon oxide is formed to the side wall of the gate electrode 6. Further, a silicon oxide film 9 is formed on the gate electrode 6. A silicon oxide film 10 is formed on the side wall spacer 8 and the silicon oxide film 9, and a silicon nitride film 12 is formed on the silicon oxide film 10.

A store electrode 11 for the information storage capacitance device C is formed on the silicon nitride film 12. The storage electrode 11 has a first layer (lower layer) fin 11a and a second layer (upper layer) fin 11b formed thereon. The lower layer fin 11a comprises a second layer polycrystal silicon film, while the upper layer fin 11b is formed with a third layer polycrystal silicon film. An n-type impurity (for example P) is introduced into the polycrystal silicon films constituting the fins 11a and 11b for reducing the resistance value.

The storage electrode 11 of the information storage capacitance device C is connected with one of the semiconductor regions 7 of the memory cell connecting MISFET Qt through a connection hole 13 apertured in the silicon nitride film 12, the silicon oxide film 10 and a silicon oxide film on the semiconductor region 7 (formed in the same step used for the gate oxide film 5).

A plate electrode 15 of the information storage capacitance device C is formed above the storage electrode 11 with a dielectric film 14 interposed therebetween. The dielectric film 14 is formed with an insulation film comprising a lamination of a silicon nitride film and a silicon oxide film. The plate electrode 15 is formed with a polycrystal silicon film of a fourth layer. An n-type impurity (for example, P) is introduced into the polycrystal silicon layer for reducing the resistance value.

A data line DL is formed in a layer above the information storage capacitor C of the memory cell with a BPSG film 17 and a silicon oxide film 27 being interposed between the data line DL and the capacitor C. Further, a wiring 18 constituting a portion of the guard ring GR is formed on the silicon oxide film 27 at the outer circumference of the chip.

The BPSG film 17 is disposed for electrically isolating the information storage capacitance device C and the data line DL disposed in a layer thereabove, as well as for moderating the step in the memory array MA and the step in the peripheral circuits caused by disposing the information storage capacitance device C above the memory cell selecting MISFET Qt. The BPSG film 17 contains boron at more than 10 mol % (for example, about 13 mol %) for improving the reflowing property of the film.

The data line DL and the wiring 18 are constituted with a polycide film formed by laminating a tungsten silicide ($WSi_x$) film on the polycrystal silicon film. The data line DL is connected with one of the semiconductor regions 7 of the memory cell selecting MISFET through a connection hole 19 apertured in the silicon oxide film 27 and the BPSG film 17. Further, the wiring 18 is electrically connected with the semiconductor region 7 of the p-type well 2 through a connection hole 29 apertured in the silicon oxide film 27 and the BPSG film 17.

Y select lines YS are formed above the data line DL with a silicon oxide film 28 and a BPSG film 20 interposed between the data line DL and the Y select lines YS. Further, wirings 21 constituting a portion of the guard ring GR are formed on the BPSG film 20 at the outer circumference of the chip. The BPSG film 20 is disposed for electrically isolating the data line DL and the Y select line YS in a layer thereabove, as well as for moderating the step in the memory array MA and the step in the peripheral circuits caused by disposing the data line DL in the layer above the information storage capacitance device C. Like that the BPSG film 17, the BPSG film 20 contains boron at more than 10 mol % (for example, about 13 mol %) for improving the reflowing property of the film.

The Y select line YS and the wiring 21 are made of a tungsten (W) film. The wiring 21 is connected through a connection hole 22 apertured in the BPSG film 20 and the silicon oxide film 28 with the wiring 18 in a layer therebelow. In periphery circuit regions not illustrated, wirings constructed with the W film of the same layer as the Y select line YS and the wiring 21 are formed.

A shunting word line SWL is formed above the Y select line YS with the interlayer insulation film formed therebetween. Wirings 24 for constituting a portion of the guard ring GR are formed on the interlayer insulation film 23 at the outer circumference of the chip. The interlayer insulation film 23 is constituted with a three layered insulation film comprising a lamination of a silicon oxide film, a spin-on-glass layer and another silicon oxide layer. The shunting word line SWL and the wiring 24 are constituted with a three layered conductive film comprising a lamination of a titanium tungsten (TiW) film, an Al film and another TiW film.

The wiring 24 is connected with the wiring 21 in the lower layer by way of a connection hole 25 apertured in the interlayer insulation film 23. That is, the guard ring GR disposed at the outer circumference of the semiconductor chip 1 is constituted with three layers of wirings 18, 21 and 24 connected with each other through the connection hole 29 apertured in the silicon oxide film 27 and the BPSG film 17, the connection hole 22 apertured in the BPSG film 20 and the silicon oxide film 28, and the connection hole 25 apertured in the interlayer insulation film 23. The wirings 18, 21, 24 inhibit moisture or the like intruding from the side wall of the semiconductor chip 1 from further intruding to the inside of the chip.

A passivation film 26 for protecting the surface of the semiconductor chip 1 is formed in the layer above the shunting word line SWL and the wiring 24. The passivation film 26 is constituted with a two layered insulation film comprising a lamination of a silicon oxide film 26a and a silicon nitride film 26b deposited by a plasma CVD method.

In accordance with the present invention, a deep slit S is formed at the outermost circumference of the semiconductor chip 1 from the surface of the passivation film 26 as far as the BPSG film 17. In the embodiment shown in FIG. 2, the bottom portion of the slit S penetrates at least a boundary between the interlayer insulation film 23 and the BPSG film 20 containing boron at a high concentration in a layer therebelow. If desired, it may further penetrate into the BPSG film 17, as shown in FIG. 2. Indeed, the slit can penetrate completely through the BPSG film 17 and the insulation film in a layer therebelow and reach the surface of the semiconductor substrate 1. Alternatively, as will be discussed later with regard to FIG. 14, it is also possible to obtain good results in a case where the slit does not reach the BPSG film 20 at all.

Figure 2:
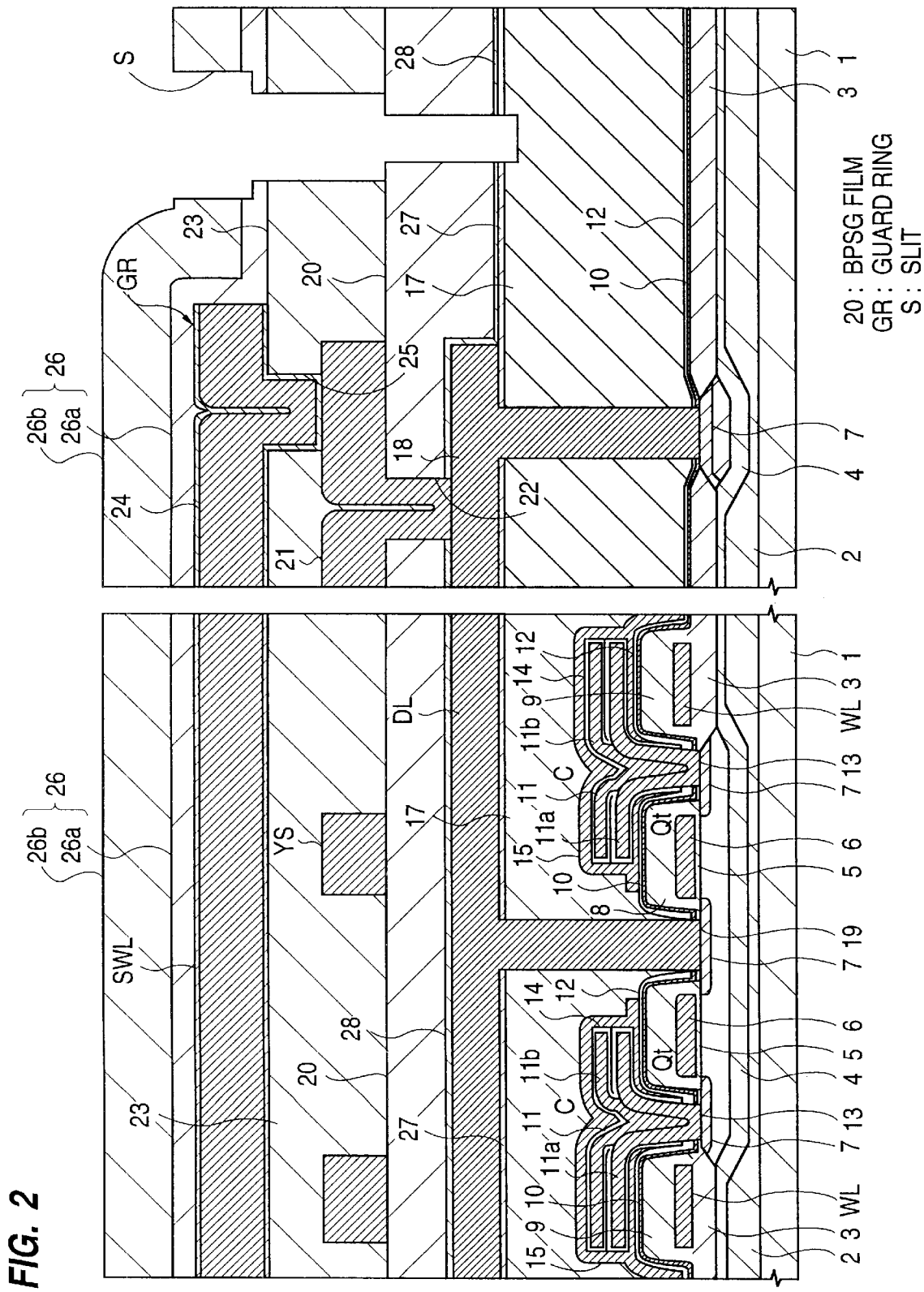
FIG. 2 is a cross sectional view of a principal portion of a semiconductor chip showing a DRAM as one embodiment according to the present invention.

As described above, in the DRAM of this embodiment shown in FIG. 2, the slit S is formed further to the outside of the guard ring GR formed along the outer circumference of the main surface of the semiconductor chip such that the bottom reaches a position at least deeper than the boundary between the interlayer insulation film 23 and the BPSG film 20 in a layer therebelow.

In the arrangement described above, even if cracks formed at the boundary between the BPSG film 20 containing boron at a high concentration and the interlayer insulation film 23 grow along the boundary to the inside of the chip, the development of the cracks is stopped by the slit S. This alleviates the concern that the guard ring GR might be disconnected by the cracks. Accordingly, moisture or contaminating materials intruding from the outside through the cracks are inhibited by the guard ring GR and do not intrude further to the inside of the chip, so that wiring corrosion previously caused by such cracks in prior art devices can be prevented reliably.

Figure 3:
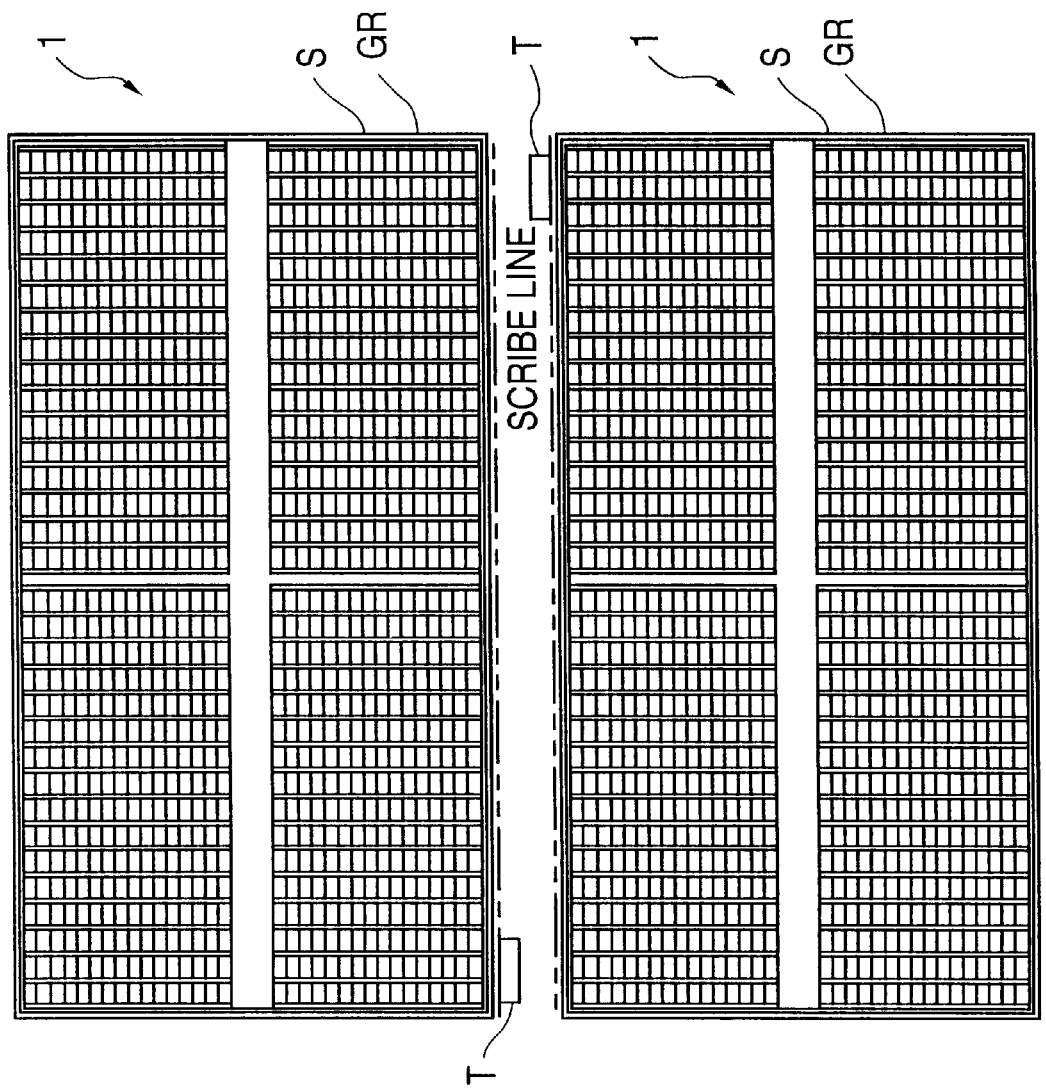
FIG. 3 is a plan view showing a target pattern disposed on scribe lines of a semiconductor wafer forming a DRAM as an embodiment according to the present invention.

Further, according to the DRAM of this embodiment having the slit S described above, tungsten (W) target patterns T can be disposed on scribe lines of the wafer in the wafer process as shown in FIG. 3.

In the wafer process, the target pattern is disposed on each of conductor layers on the scribe lines of the wafer, and upper and lower patterns are aligned by detecting the position of the target patterns during photolithography. However, if the W target pattern is disposed on the scribe lines, since tungsten is an extremely hard metal, cracks are formed at a portion of the target pattern upon dicing the wafer along the scribe lines through which moisture may intrude in the chip to possibly cause wiring corrosion. Therefore, the W target patterns have to be disposed at a position outside of the scribe lines in the prior art, which imposes a restriction for the number of chips obtainable per one sheet of wafer.

According to this embodiment, even if cracks are formed at a portion of the W target pattern T disposed on the scribe lines upon dicing and the cracks grow to the inside of the chip, since the development of the cracks is stopped by the slit S, there is no concern that the guard ring GR will be disconnected by the cracks.

Therefore, according to this embodiment, the W target patterns T can be disposed on the scribe lines of the wafer to thereby increase the number of chips obtainable per one sheet of wafer.

A description will now be provided for an embodiment of a method of forming the slit S with reference to FIGS. 4 to FIG. 11.

Figure 4:
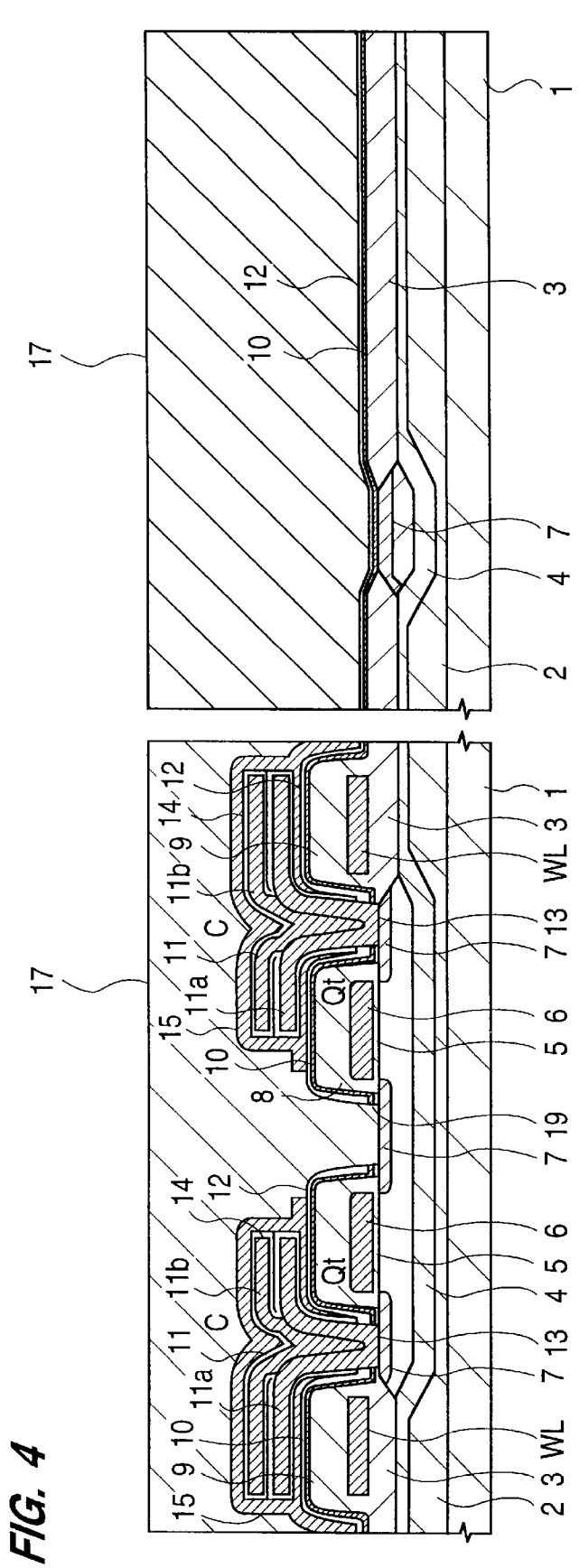
FIG. 4 is a cross sectional view of a principal portion of a semiconductor chip illustrating a method of manufacturing a DRAM as one embodiment according to the present invention.

At first, a memory cell selecting MISFET Qt that constitutes a memory cell for the DRAM is formed on a semiconductor substrate 1 and then an information storage capacitance element C is formed thereabove. Subsequently, as shown in FIG. 4, a BPSG film 17 containing about 13 mol % of boron is deposited by a CVD method in a layer above a plate electrode 15 of the information storage capacitance device C. The thickness of the BPSG film 17 is about 500 nm. Successively, annealing is applied at 850° C. for 20 minutes to reflow the BPSG film 17. Since the BPSG film 17 contains boron at a high concentration, and has good reflowing properties, the step in the memory array MA and the step in the peripheral circuit caused by disposing the information storage capacitance device C above the memory cell selecting MISFET Qt can be moderated effectively.

Figure 5:
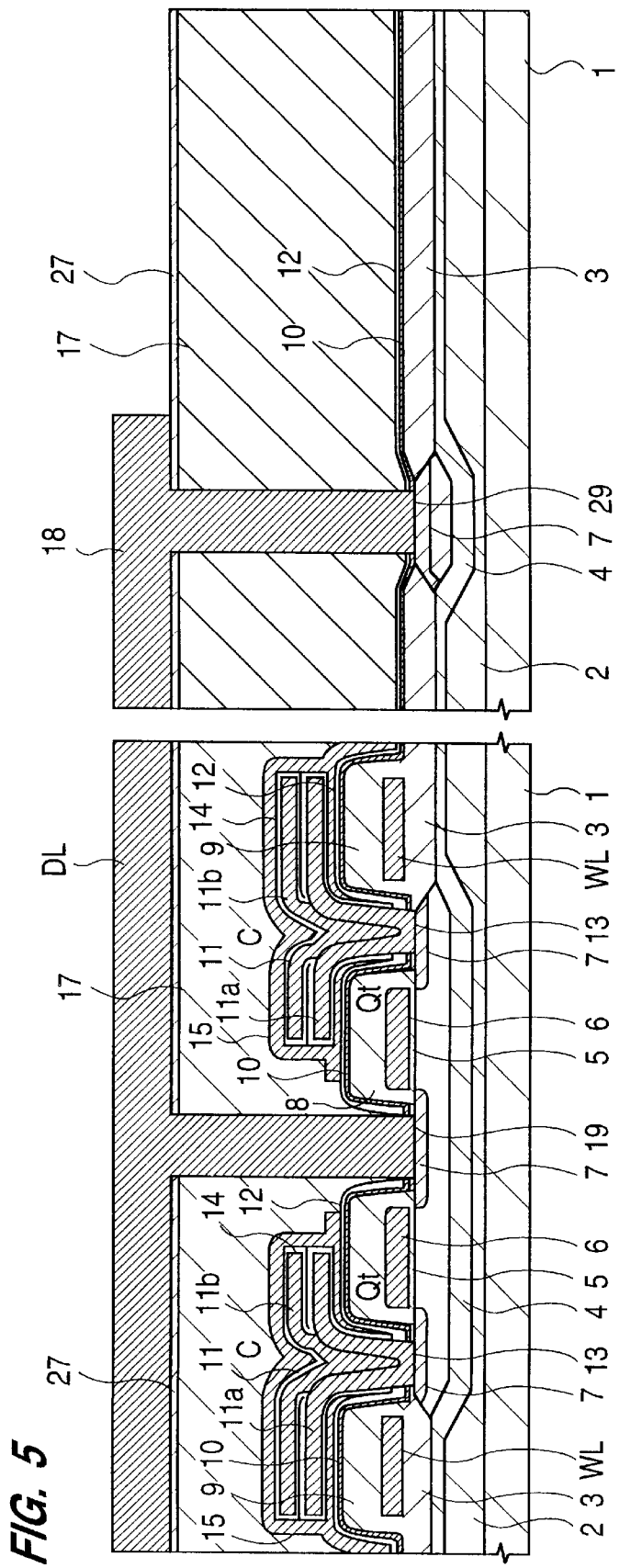

Next, as shown in FIG. 5, a silicon oxide film 27 is deposited by a CVD method on the BPSG film 17, and the silicon oxide film 27 and the BPSG film 17 are etched to form a connection hole 19 reaching one of the semiconductor regions 7 of the memory cell selecting MISFET and a connection hole 29 reaching the semiconductor region 7 of the outer circumference of the chip respectively. Subsequently, a polycide film deposited on the silicon oxide film 27 by a CVD method is patterned to form a data line DL and wirings 18.

Following this, as shown in FIG. 6, a silicon oxide film 28 and a BPSG film 20 containing boron at about 13 mol % are deposited by a CVD method in a layer above the data line DL and the wirings 18. The thickness of the BPSG film 20 is about 400 nm. Successively, annealing is applied at about 850üïC for 20 minutes to reflow the BPSG film 20. Since the BPSG film 20 contains boron at a high concentration and has good reflowing properties, the step in the memory array MA and the step in the peripheral circuits caused by disposing the data line DL in the layer above the information storage capacitance device C can be moderated effectively.

Then, as shown in FIG. 7, the BPSG film 20 and the silicon oxide film 28 are etched to form a connection hole 22 reaching the wiring 18. Two layers of W films deposited by sputtering and CVD in a layer above the BPSG film 20 are patterned to form Y select lines YS and wirings 21. The surface of the BPSG film 20 containing boron at a high concentration is exposed to and absorbs moisture in the step of forming the connection hole 22 and the step of patterning the W film to form the Y select lines YS and the wirings 21. Therefore, if an interlayer insulation film 23 is deposited on the BPSG film 20, since the adhesion at the boundary between the films is extremely low, cracks are liable to be formed on the boundary.

Next, as shown in FIG. 8, after forming an interlayer insulation film 23 by successively depositing a silicon oxide film, a spin-on-glass film and another silicon oxide film in a layer above the Y select lines YS and the wirings 21, the interlayer insulation film 23 is etched to form a connection hole 25 and the slit Sa reaching the wiring 21 are formed simultaneously. The silicon oxide film is deposited by a plasma CVD method and the spin-on-glass film is deposited by a rotary coating method. The diameter for the slit Sa is about 2 µm.

Then, as shown in FIG. 9, the three layered conductive film (TiW film, Al film and another TiW film) deposited in the layer above the interlayer insulation film 23 by a sputtering method is patterned to form a shunting word line SWL and wirings 24, to complete a guard ring GR.

A silicon oxide film 26a constituting a portion of a passivation film 26 is deposited in a layer above the shunting word line SWL and the wirings 24 by a plasma CVD method, as shown in FIG. 10. Successively, a silicon oxide film 26a in a region which is not illustrated is etched to expose a portion of wirings in the same layer used for the shunting word line SWL (wirings for peripheral circuits), thereby forming a pad for probe inspection. In this process, etching for removing the silicon oxide film 26a buried at the inside of the slit Sa is conducted simultaneously to form a new slit Sb. Since the slit Sb is formed at a position identical with the slit Sa, it is formed at a diameter greater than that of the slit Sa (about 4 $\mu$m) taking into account misalignment of a photomask. Then, after conducting a characteristic test for circuits by applying a probe to the probe inspection pad, the silicon oxide film 26a is deposited once again on the previously deposited silicon oxide film 26a to cover the probe inspection pad.

Following this, as shown in FIG. 11, after depositing a silicon nitride film 26b constituting a portion of the passivation film 26 above the silicon oxide film 26a by a plasma CVD method, the silicon nitride film 26b and the silicon oxide film 26a in a layer therebelow in a region which is not illustrated are etched to form a bonding pad for wire connection. In this process, etching for removing the silicon oxide film 26a and the silicon nitride film 26b buried at the inside of the slit Sb is conducted simultaneously to thereby complete the slit S. Since the slit S is formed at the position identical with the slit Sb, it is formed to a larger diameter than the slit Sb (about 6 $\mu$m) taking into account misalignment of a photomask.

In the method described above, since the slit Sa is formed in the etching step for forming a portion of the guard ring GR, the slit Sb is formed in the etching step for forming the probe inspection pad and the slit S is formed in the etching step for forming the bonding pad, the final slit S can be formed without increasing the number of steps for manufacturing the DRAM.

FIG. 14 shows a modified embodiment related to the slit formation method of this invention. In this embodiment, the material and thickness of each layer are the same as those of the embodiment described previously. Only the slit formation process is different from the previously described embodiment.

In the modified embodiment, a 10 -$\mu$m thick polyimide film 39 is formed on passivation film 26 to prevent software errors caused by alpha ray immersion. In the previously described embodiment, polyimide film 39 can also be formed on passivation film 26, and even formed inside slit S shown in FIGS. 1 and 3. In such a case, memory array MA and sense amplifier SA are covered by polyimide film 39. However, bonding pads would be exposed. With such an arrangement, the polyimide film 39 is preferably patterned so that the edge of polyimide film 39 corresponds to the position of guard ring GR to prevent polyimide film 39 from entering slit S. However, mask misalignment may cause polyimide film 39 to enter slit S anyway.

In the modified embodiment shown in FIG. 14, slit Sa shown in FIG. 8 and slit Sb shown in FIG. 10 are not formed. Silicon nitride film 26b is deposited by plasma CVD to form passivation film 26, and part of silicon nitride film 26b is then etched to expose bonding pads for wire connection. Slit S' is formed simultaneously in the etching process. Slit S' is deep enough to completely separate passivation film 26 and reaches inter-layer insulation film 23 to ensure an etching margin.

As described above, high-rigidity silicon nitride film 26b is separated by slit S' between a dicing area and the semiconductor chip. Therefore, even if a crack occurs at an interface between BPSG film 20 and inter-layer insulation film 23, the crack only extends to slit S' of silicon nitride film 26b and stops at slit S'. That is, the crack does not extend into the semiconductor chip beyond slit S'.

When there is no slit S' in silicon nitride film 26b, the crack extends into the semiconductor chip and to the surface of the semiconductor substrate, because the semiconductor chip is covered by the high-rigidity film except for the bonding pads.

As shown in FIG. 14, the ring-shaped slits such as S (FIG. 1) and S' (FIG. 14) are formed at a distance L2 (25 $\mu$m) from the edge of diced chip 1 and at L1 (5 $\mu$m) outside guard ring GR. That is, slits S and S' are preferably formed closer to guard ring GR than to the edge of the diced chip.

BPSG film 20, which includes high-concentration boron, is exposed externally at the edge of chip 1 and easily absorbs moisture. Chip 1 is sealed by epoxy resin. However, since epoxy resin absorbs moisture, BPSG film 20 easily absorbs moisture at the edge of chip 1. When chip temperature becomes high, moisture-containing BPSG film 20, which includes high-concentration boron, swells and stress occurs. The parts of BPSG film 20 that have low adhesiveness tend to peel and crack from the stress.

Forming slits S and S' stops the cracks at slits S and S' and prevents such cracks from extending inside, because stress is released outside the chip at slits S and S'. This is the case even where the slit does not extend into the BPSG film, as shown in FIG. 14.

Of course, BPSG film 20, which includes high-concentration boron, absorbs moisture from slits S and S'. However, in the arrangement of the present invention, only the portion of the BPSG film 20 below the area between guard ring GR and slits S and S' produces cracks. Therefore, since the stress caused by swelling of BPSG film 20 below this area is small, no peeling is expected to occur. Indeed, in some cases, cracks can be prevented from expanding into the inside of the chip even if the slit only goes through the passivation layer 26, and does not extend into the BPSG film 20. This is the case since the high rigidity of the silicon nitride film is a significant factor in expanding the crack, and providing the slit through the silicon nitride layer 26b is very beneficial in preventing the cracks from extending into the body of the chip.

High rigidity, which is a characteristic of certain films, can be expressed with Young's modulus E. Compressive stress $\sigma$ and strain $\Delta x$ can be expressed by $\sigma = E\Delta x$ from Hooke's law. Here, Young's modulus is 70 GPa for SiO2, 295 GPa for SiN, and 170 GPa for Si. It is obvious that the SiN film is extremely resistant to stress; that is, it has high rigidity. Therefore, silicon nitride film 26b, which is used as the passivation film of the chip sealed by resin, has an extremely high rigidity as a film characteristic.

The fact that the silicon nitride film 26b has a thickness of 1.0 to 1.5 $\mu$m also increases the rigidity of silicon nitride film 26b in passivation film 26. For reference, silicon oxide film 26a is 700 to 900 nm, BPSG film 17 is 400 to 600 nm, BPSG film 20 is 300 to 500 nm, and inter-layer insulation film 23 is 700 to 900 nm. These film thicknesses are the same as those of the previously described embodiment.

This modified embodiment shown in FIG. 14 has the following advantages over the previously described embodiment. Specifically, an etched residue can occur in slit Sa shown in FIG. 9 during patterning of the three-layer conductor film in the previously described embodiment. This residue can peel and become a contaminant in later processes. The contaminant may cause a short circuit between bonding pads.

In this modified embodiment of FIG. 14, on the other hand, no slit is formed during patterning of the three-layer conductor film. Instead, the slit S' is formed simultaneously with the etching process for exposing bonding pads after passivation film 26 is formed. Therefore, no short circuit between bonding pads due to the etched residue will occur. In addition, slit S' can be formed without increasing the number of processes.

Chip 1 described in these embodiments is preferably sealed by rectangular sealing material 30 made of epoxy resin, as shown in FIG. 15. Leads 33, 34, 35, and 36 are bonded by polyimide resin films to the main surface of chip 1, on which semiconductor elements and bonding pads BP are formed. Bonding pads BP on chip 1 are electrically connected to leads 33, 34, 35, and 36 through bonding wires 32. Leads 33 and 35 protrude to the side of rectangular sealing material 30, and leads 34 and 35 protrude to another side of rectangular sealing material 30.

While the invention made by the present inventor has been explained concretely with reference to the preferred embodiments it will be apparent that the present invention is not restricted to these foregoing embodiments but can be modified variously within a range not departing from the spirit of the invention.

For example, although descriptions have been made in the foregoing embodiments of applying the present invention to a DRAM in which the data lines are disposed above the information storage capacitance device, the present invention is not restricted only to such an arrangement, but is applicable also to a DRAM in which the information storage capacitance device is disposed above the data lines. Also, although the present invention has been described as especially useful for stacked capacitor arrangements, it is not limited to such arrangements, and is also useful in other memory cell arrangements.

Further, the present invention is applicable not only to DRAMs but also to all devices in which a BPSG film containing boron at a high concentration is used for a portion of an interlayer insulation film.

Advantageous effects obtained by the present invention as disclosed by the present application will be summarized below.

(1) According to the present invention, even when cracks formed at the boundary between a silicon oxide film containing boron at a high concentration and other interlayer insulation film grow along the boundary to the inside of the chip, development of the cracks can be stopped by the slit, so that wiring corrosion caused by the cracks can be reliably prevented.

(2) According to the present invention, since the slit is formed by utilizing the etching step for forming the guard ring, and the etching step of aperturing the passivation film covering the surface of the semiconductor chip to form the pad, the slit can be formed without increasing the number of manufacturing steps.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description, and all changes which come within the meaning and range of equivalency of the claims are therefor intended to be embraced therein.

What is claimed is:

1. A semiconductor integrated circuit device in which an interlayer insulation film deposited on a semiconductor chip includes a first boron-containing silicon oxide film and a second film formed on the first boron-containing silicon oxide film, wherein a slit is disposed along the periphery of the semiconductor chip at a depth to extend at least into said second film, wherein the concentration of boron in the first boron-containing silicon oxide film is not less than 10 mol %.

2. A semiconductor integrated circuit device in which an interlayer insulation film deposited on a semiconductor chip includes a first boron-containing silicon oxide film and a second film formed on the first boron-containing silicon oxide film, wherein a slit is disposed along the periphery of the semiconductor chip at a depth to extend at least into said second film, wherein the concentration of boron in the first boron-containing silicon oxide film is about 13 mol %.

3. A semiconductor integrated circuit device comprising:
a semiconductor substrate having a first region which is a peripheral portion of a main surface and a second region inside of the first region in said main surface,
a plurality of MISFETs each formed in the second region and each having a source region, a drain region and a gate electrode,
a boron containing silicon oxide film formed in the first region and the second region, and having a first connection opening in the first region for exposing a semiconductor region formed on the main surface of the semiconductor substrate and a second connection opening in the second region for exposing the source region or the drain region of at least one of the plurality of MISFETs,
a first conductor layer formed in the first region, in the first connection opening and on the boron-containing silicon oxide film,
a second conductor layer formed in the second connection opening and on the boron-containing silicon oxide film in the second region,
a silicon oxide film not containing boron formed above the first and the second conductor layers, wherein at least a portion of the silicon oxide film not containing boron is in contact with the boron-containing silicon oxide film,
wherein the first conductor layer is disposed continuously along the periphery of the main surface, and a groove penetrating a boundary between the boron-containing silicon oxide film and the silicon oxide film not containing boron is formed between the first conductor layer in the first region and the periphery of the main surface to prevent the spread of cracks caused by poor adhesion between the boron-containing silicon oxide film and the silicon oxide film not containing boron.

4. A semiconductor integrated circuit device comprising:
a semiconductor substrate having a first region which is a peripheral portion of a main surface and a second region inside of the first region in said main surface,
a plurality of MISFETs each formed in the second region and each having a source region, a drain region and a gate electrode,
a boron containing silicon oxide film formed in the first region and the second region, and having a first connection opening in the first region for exposing a semiconductor region formed on the main surface of the semiconductor substrate and a second connection opening in the second region for exposing the source region or the drain region of at least one of the plurality of MISFETs, a first conductor layer formed in the first region, in the first connection opening and on the boron-containing silicon oxide film, a second conductor layer formed in the second connection opening and on the boron-containing silicon oxide film in the second region, and a silicon oxide film not containing boron formed above the first and the second conductor layers, wherein at least a portion of the silicon oxide film not containing boron is in contact with the boron-containing silicon oxide film, wherein the first conductor layer is disposed continuously along the periphery of the main surface, and a groove penetrating a boundary between the boron-containing silicon oxide film and the silicon oxide film not containing boron is formed between the first conductor layer in the first region and the periphery of the main surface, wherein said main surface of the semiconductor substrate is rectangular.

5. A semiconductor integrated circuit device comprising:
a semiconductor substrate having a first region which is a peripheral portion of a main surface and a second region inside of the first region in said main surface,
a plurality of MISFETs each formed in the second region and each having a source region, a drain region and a gate electrode,
a boron containing silicon oxide film formed in the first region and the second region, and having a first connection opening in the first region for exposing a semiconductor region formed on the main surface of the semiconductor substrate and a second connection opening in the second region for exposing the source region or the drain region of at least one of the plurality of MISFETs,
a first conductor layer formed in the first region, in the first connection opening and on the boron-containing silicon oxide film,
a second conductor layer formed in the second connection opening and on the boron-containing silicon oxide film in the second region, and
a silicon oxide film not containing boron formed above the first and the second conductor layers, wherein at least a portion of the silicon oxide film not containing boron is in contact with the boron-containing silicon oxide film,
wherein the first conductor layer is disposed continuously along the periphery of the main surface, and a groove penetrating a boundary between the boron-containing silicon oxide film and the silicon oxide film not containing boron is formed between the first conductor layer in the first region and the periphery of the main surface, wherein the concentration of boron in the boron-containing silicon oxide film is not less than 10 mol %.

6. A semiconductor integrated circuit device comprising:
a semiconductor substrate having a first region which is a peripheral portion of a main surface and a second region inside of the first region in said main surface,
a plurality of MISFETs each formed in the second region and each having a source region, a drain region and a gate electrode,
a boron containing silicon oxide film formed in the first region and the second region, and having a first connection opening in the first region for exposing a semiconductor region formed on the main surface of the semiconductor substrate and a second connection opening in the second region for exposing the source region or the drain region of at least one of the plurality of MISFETs,
a first conductor layer formed in the first region, in the first connection opening and on the boron-containing silicon oxide film,
a second conductor layer formed in the second connection opening and on the boron-containing silicon oxide film in the second region, and
a silicon oxide film not containing boron formed above the first and the second conductor layers, wherein at least a portion of the silicon oxide film not containing boron is in contact with the boron-containing silicon oxide film,
wherein the first conductor layer is disposed continuously along the periphery of the main surface, and a groove penetrating a boundary between the boron-containing silicon oxide film and the silicon oxide film not containing boron is formed between the first conductor layer in the first region and the periphery of the main surface, wherein the concentration of boron in the boron-containing silicon oxide film is about 13 mol %.

7. A semiconductor integrated circuit device comprising:
an interlayer insulation film deposited on a semiconductor chip including a first boron-containing silicon oxide film and a second film, not containing boron, formed on the first boron-containing silicon oxide film;
a passivation film, having a higher rigidity than first boron-containing film, formed on the second film; and
a slit, disposed along the periphery of the semiconductor chip, to extend to a predetermined depth from an upper surface of the passivation film into the semiconductor integrated device, wherein the location and depth of the slit are selected to prevent the spread of cracks caused by poor adhesion between the first boron-containing silicon oxide film and the second film which does not contain boron, wherein the concentration of boron in the first boron-containing silicon oxide film is not less than 10 mol %.

8. A semiconductor integrated circuit device comprising:
an interlayer insulation film deposited on a semiconductor chip including a first boron-containing silicon oxide film and a second film, not containing boron, formed on the first boron-containing silicon oxide film;
a passivation film, having a higher rigidity than first boron-containing film, formed on the second film; and
a slit, disposed along the periphery of the semiconductor chip, to extend to a predetermined depth from an upper surface of the passivation film into the semiconductor integrated device, wherein the location and depth of the slit are selected to prevent the spread of cracks caused by poor adhesion between the first boron-containing silicon oxide film and the second film which does not contain boron, wherein the concentration of boron in the first boron-containing silicon oxide film is about 13 mol %.

9. A semiconductor integrated circuit device comprising:
an interlayer insulation film deposited on a semiconductor chip including a first boron-containing silicon oxide film and a second film, not containing boron, formed on the first boron-containing silicon oxide film;

a passivation film, having a higher rigidity than first boron-containing film, formed on the second film; and a slit, disposed along the periphery of the semiconductor chip, to extend to a predetermined depth from an upper surface of the passivation film into the semiconductor integrated device, wherein the location and depth of the slit are selected to prevent the spread of cracks caused by poor adhesion between the first boron-containing silicon oxide film and the second film which does not contain boron, wherein the integrated semiconductor circuit is a DRAM having a memory cell of a stacked structure in which an information storage capacitance device is disposed above a memory cell selecting MISFET.

10. A semiconductor integrated circuit device according to claim 1 or 2, wherein said slit extends completely through the second film and into the first boron-containing silicon oxide film.

11. A semiconductor integrated circuit device according to 1 or 2, wherein said slit extends completely through the second film and the first boron-containing silicon oxide film, and into a third film on which the first boron-containing silicon oxide film is formed.

12. A semiconductor integrated circuit device according to claim 7, 8 or 9, wherein said slit extends at least through the passivation film.

13. A semiconductor integrated circuit device according to claim 7, 8 or 9, wherein said slit extends through said passivation film into said second film.

14. A semiconductor integrated circuit device according to claim 7, 8 or 9, wherein said slit extends completely through said second film and into the first boron-containing silicon oxide film.

15. A semiconductor integrated circuit device according to claim 7, 8 or 9, wherein said slit extends completely through the second film and the first boron-containing silicon oxide film, and into a base layer on which the first boron-containing silicon oxide film is formed.

16. A semiconductor integrated circuit device according to claim 3, further comprising a passivation layer formed over said silicon oxide film not containing boron, and wherein said groove penetrates through said passivation layer.

17. A method of manufacturing a semiconductor integrated circuit device on a semiconductor wafer at a device forming area which is surrounded by a scribe line comprising the steps of:

forming a first insulation film over a main surface of the semiconductor wafer, forming a first film over the main surface of the semiconductor wafer;

forming a second insulation film of a silicon nitride film over the first insulation film and the first film, forming a first conductor layer below the second insulation film;

forming a slit at a periphery of the device forming area, and an aperture in the second insulation film to reveal the first conductor layer in order to form a bonding pad; and dicing the semiconductor wafer on the scribe line to provide a chip, wherein the first film has a boundary with the first insulation film, the first insulation film is a boron containing silicon oxide film, and the slit is located between the bonding pad and the scribe line on the chip to prevent the spread of cracks caused by poor adhesion between the boron-containing silicon oxide first insulation film and the second insulation film, wherein the bonding pad is formed in an etching step in which the slit is formed.

18. A method of manufacturing a semiconductor integrated circuit device on a semiconductor wafer at a device forming area which is surrounded by a scribe line comprising the steps of:

forming a first insulation film over a main surface of the semiconductor wafer, forming a first film over the main surface of the semiconductor wafer;

forming a second insulation film of a silicon nitride film over the first insulation film and the first film, forming a first conductor layer below the second insulation film;

forming a slit at a periphery of the device forming area, and an aperture in the second insulation film to reveal the first conductor layer in order to form a bonding pad; and dicing the semiconductor wafer on the scribe line to provide a chip, wherein the first film has a boundary with the first insulation film, the first insulation film is a boron containing silicon oxide film, and the slit is located between the bonding pad and the scribe line on the chip to prevent the spread of cracks caused by poor adhesion between the boron-containing silicon oxide first insulation film and the second insulation film, wherein the concentration of boron in the boron containing silicon oxide film is not less than 10 mol %.

19. A method of manufacturing a semiconductor integrated circuit device on a semiconductor wafer at a device forming area which is surrounded by a scribe line comprising the steps of:

forming a first insulation film over a main surface of the semiconductor wafer, forming a first film over the main surface of the semiconductor wafer;

forming a second insulation film of a silicon nitride film over the first insulation film and the first film, forming a first conductor layer below the second insulation film;

forming a slit at a periphery of the device forming area, and an aperture in the second insulation film to reveal the first conductor layer in order to form a bonding pad; and dicing the semiconductor wafer on the scribe line to provide a chip, wherein the first film has a boundary with the first insulation film, the first insulation film is a boron containing silicon oxide film, and the slit is located between the bonding pad and the scribe line on the chip to prevent the spread of cracks caused by poor adhesion between the boron-containing silicon oxide first insulation film and the second insulation film, wherein the concentration of boron in the boron containing silicon oxide film is about 13 mol %.

20. A method of manufacturing a semiconductor integrated circuit device as defined in claim 17, wherein the slit is located continuously along the periphery of the chip.

21. A method of manufacturing a semiconductor integrated circuit device as defined in claim 17, wherein the first film is a silicon oxide insulation film.

22. A method of manufacturing a semiconductor integrated circuit device as defined in claim 17, further comprising a step of forming a second conductor layer under the first insulation film.

23. A method of manufacturing a semiconductor integrated circuit device as defined in claim 17, further comprising a step of reflowing the boron containing silicon oxide film.

24. A method of manufacturing a semiconductor integrated circuit device on a semiconductor wafer at a device forming area which is surrounded by a scribe line comprising the steps of:

forming a first insulation film over a main surface of the semiconductor wafer;

forming a second insulation film over the first insulation film;

forming a third insulation film over the main surface of the semiconductor wafer;

forming a fourth insulation film over the third insulation film;

forming a first conductor layer over the main surface of the semiconductor wafer;

forming a fifth insulation film of a silicon nitride film over the first conductor layer;

forming an aperture in the fifth insulation film to reveal the first conductor layer in order to form a bonding pad, and forming a slit at a periphery of the device forming area in the fifth insulation film; and dicing the semiconductor wafer on the scribe line to provide a chip;

wherein the adhesion at a first boundary between the first insulation film and the second insulation film is lower than the adhesion at a second boundary between the third insulation film and the fourth insulation film, and the slit is located between the bonding pad and the scribe line on the chip to prevent the spread of cracks caused by the lower adhesion between the first insulation film and the second insulation film.

25. A method of manufacturing a semiconductor integrated circuit device as defined in claim 24, wherein the slit is made by a process to etch the silicon nitride film.

26. A method of manufacturing a semiconductor integrated circuit device as defined in claim 24, wherein the slit is located continuously at the periphery of the chip.

27. A method of manufacturing a semiconductor integrated circuit device as defined in claim 24, wherein the bonding pad is made in the etching step to make the slit.

28. A method of manufacturing a semiconductor integrated circuit device as defined in claim 24, wherein the third and fourth insulation films are silicon oxide films.

29. A method of manufacturing a semiconductor integrated circuit device as defined in claim 24, further comprising a step of forming a second conductor layer under the first insulation film.

30. A method of manufacturing a semiconductor integrated circuit device as defined in claim 24, wherein the first insulation film is a boron containing silicon oxide film, and wherein the method further comprises a step of reflowing the boron containing silicon oxide film.

31. A method of manufacturing a semiconductor integrated circuit device on a semiconductor wafer at a device forming area which is surrounded by a scribe line comprising the steps of:

forming a first insulation film over a main surface of the semiconductor wafer, forming a first film over the main surface of the semiconductor wafer;

forming a second insulation film of a silicon nitride film over the first insulation film and the first film, forming a first conductor layer below the second insulation film;

dividing the second insulation film at a periphery of the device forming area from the second insulation film at a central area of the device forming area, forming an aperture in the second insulation film to reveal the first conductor layer in order to form a bonding pad;

dicing the semiconductor wafer on the scribe line to provide a chip;

wherein the first film has a boundary with the first insulation film, the first insulation film is a boron containing silicon oxide film, and the central area of the device forming area includes a bonding pad.

32. A method of manufacturing a semiconductor integrated circuit device as defined in claim 31, wherein the concentration of boron in the boron containing silicon oxide film is not less than 10 mol %.

33. A method of manufacturing a semiconductor integrated circuit device as defined in claim 31, wherein the concentration of boron in the boron containing silicon oxide film is about 13 mol %.

34. A method of manufacturing a semiconductor integrated circuit device as defined in claim 31, wherein the first film is a silicon oxide insulation film.

35. A method of manufacturing a semiconductor integrated circuit device as defined in claim 31, wherein the bonding pad is formed in an etching step in which the second insulation film is divided.

36. A method of manufacturing a semiconductor integrated circuit device as defined in claim 31, further comprising a step forming a second conductor layer under the first insulation layer.

37. A method of manufacturing a semiconductor integrated circuit device as defined in claim 31, further comprising a step of reflowing the boron containing silicon oxide film.

38. A method of manufacturing a semiconductor integrated circuit device on a semiconductor wafer at a device forming area which is surrounded by a scribe line comprising the steps of:

forming a first insulation film over a main surface of the semiconductor wafer;

forming a second insulation film over the first insulation film;

forming a third insulation film over the main surface of the semiconductor wafer;

forming a fourth insulation film over the third insulation film;

forming a first conductor layer over the main surface of the semiconductor wafer;

forming a fifth insulation film of a silicon nitride film over the first conductor layer;

dividing the fifth insulation film at a periphery of the device forming area from the fifth insulation film at a central area of the chip device forming area;

forming an aperture in the fifth insulation film to reveal the first conductor layer in order to form a bonding pad; and dicing the semiconductor wafer on the scribe line to provide a chip, wherein the adhesion at a first boundary between the first insulation film and the second insulation film is lower than the adhesion at a second boundary between the third insulation film and the fourth insulation film, and the central area of the device forming area includes a bonding pad.

39. A method of manufacturing a semiconductor integrated circuit device as defined in claim 38, wherein the first insulation film is comprised of a boron containing silicon oxide film, and wherein the concentration of boron in the boron containing silicon oxide film is not less than 10 mol %.

40. A method of manufacturing a semiconductor integrated circuit device as defined in claim 39, wherein the concentration of boron in the boron containing silicon oxide film is about 13 mol %.

41. A method of manufacturing a semiconductor integrated circuit device as defined in claim 38, wherein the third and fourth insulation films are silicon oxide insulation films.

42. A method of manufacturing a semiconductor integrated circuit device as defined in claim 38, wherein the bonding pad is formed in an etching step in which the fifth insulation film is divided.

43. A method of manufacturing a semiconductor integrated circuit device as defined in claim 38, further comprising a step of forming a second conductor layer under the first insulation film.

44. A method of manufacturing a semiconductor integrated circuit device as defined in claim 37, wherein the first insulation film is comprised of a boron containing silicon oxide film and wherein the method further comprises a step of reflowing the boron containing silicon oxide film.

* * * * *